United States Patent
Chao et al.

(10) Patent No.: US 11,025,260 B1
(45) Date of Patent: Jun. 1, 2021

(54) PHASE-LOCKED LOOP (PLL) WITH MULTIPLE ERROR DETERMINERS

(71) Applicant: Qualcomm Incorporated, San Diego, CA (US)

(72) Inventors: Yue Chao, San Diego, CA (US); Marco Zanuso, Encinitas, CA (US); Rajagopalan Rangarajan, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/003,923

(22) Filed: Aug. 26, 2020

(51) Int. Cl.
*H03L 7/099* (2006.01)
*H03L 7/197* (2006.01)
*H03L 7/089* (2006.01)
*H03L 7/093* (2006.01)

(52) U.S. Cl.
CPC .......... *H03L 7/0992* (2013.01); *H03L 7/0893* (2013.01); *H03L 7/093* (2013.01); *H03L 7/1976* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 7,746,182 B2 * | 6/2010 | Ramaswamy | ............ | H03L 7/10 331/44 |
| 7,973,606 B2 * | 7/2011 | Kim | ...................... | H03L 7/1976 331/12 |
| 8,222,932 B2 * | 7/2012 | Demirkan | ............... | H03L 7/087 327/147 |
| 8,373,469 B2 * | 2/2013 | Kim | ......................... | H03L 7/23 327/157 |
| 8,446,190 B2 * | 5/2013 | Rhee | ..................... | H03K 23/507 327/155 |
| 8,513,990 B2 * | 8/2013 | Ozawa | ..................... | H03L 7/18 327/156 |
| 8,724,765 B2 * | 5/2014 | Liu | ......................... | H03L 7/093 375/376 |
| 9,520,889 B2 * | 12/2016 | Unruh | .................. | H03L 7/1974 |

(Continued)

OTHER PUBLICATIONS

Banerjee, Delta Sigma PLLs Raise the Standard for Performance, Jan. 2011, 4 pages.

(Continued)

*Primary Examiner* — Adam D Houston
(74) *Attorney, Agent, or Firm* — Colby Nipper/Qualcomm

(57) ABSTRACT

An apparatus is disclosed that implements a phase-locked loop (PLL) that uses multiple error determiners as part of a feedback loop. In an example aspect, an apparatus for generating a frequency includes a PLL. The PLL includes a loop filter, a voltage-controlled oscillator (VCO), a frequency divider, and multiple error determiners. The loop filter includes a filter input node and a filter output node. The VCO includes a VCO input node and a VCO output node. The VCO input node is coupled to the filter output node. The frequency divider includes a divider input node and multiple divider output nodes. The divider input node is coupled to the VCO output node. The multiple error determiners are coupled between the multiple divider output nodes and the filter input node.

20 Claims, 11 Drawing Sheets

(56) References Cited

U.S. PATENT DOCUMENTS

| | | | | |
|---|---|---|---|---|
| 9,954,542 | B1* | 4/2018 | Kong | H03L 7/183 |
| 2002/0136341 | A1* | 9/2002 | Huh | H03L 7/087 |
| | | | | 375/376 |
| 2007/0165427 | A1* | 7/2007 | McDonald | H02M 3/156 |
| | | | | 363/41 |
| 2010/0225361 | A1* | 9/2010 | Rhee | H03L 7/1976 |
| | | | | 327/105 |
| 2010/0321120 | A1* | 12/2010 | Kim | H03L 7/1976 |
| | | | | 331/25 |
| 2010/0329388 | A1* | 12/2010 | Ko | H03L 7/081 |
| | | | | 375/300 |
| 2014/0312936 | A1* | 10/2014 | Abdel-Haleem | H03L 7/193 |
| | | | | 327/118 |
| 2015/0004919 | A1* | 1/2015 | Ek | H04L 7/0331 |
| | | | | 455/75 |
| 2015/0288367 | A1* | 10/2015 | Kim | H03L 7/18 |
| | | | | 327/117 |
| 2018/0302097 | A1* | 10/2018 | Guo | H03L 7/1976 |
| 2019/0074842 | A1* | 3/2019 | Sun | H03L 7/197 |
| 2019/0165782 | A1 | 5/2019 | Zhao et al. | |
| 2019/0165792 | A1* | 5/2019 | Huh | H03L 7/0816 |
| 2019/0334530 | A1* | 10/2019 | Gupta | H03L 7/093 |
| 2020/0076440 | A1* | 3/2020 | Ng | H03L 7/081 |

OTHER PUBLICATIONS

Galton, Delta-Sigma Fractional-N Phase-Locked Loops, Jan. 2017, 11 pages.

\* cited by examiner

PHASE-LOCKED LOOP (PLL) WITH MULTIPLE ERROR DETERMINERS

TECHNICAL FIELD

This disclosure relates generally to wireless communication using an electronic device and, more specifically, to a phase-locked loop (PLL) for use therein.

BACKGROUND

Electronic devices include traditional computing devices such as desktop computers, notebook computers, smartphones, wearable devices like a smartwatch, internet servers, and so forth. However, electronic devices also include other types of computing devices such as personal voice assistants, programmable thermostats, automotive electronics, robotics, intelligent devices embedded in other machines like refrigerators and industrial tools, Internet-of-Things (IoT) devices, and the like. These various electronic devices provide information, entertainment, social interaction, security, safety, productivity, transportation, and other services to human users. Thus, electronic devices play crucial roles in many aspects of modern society.

Many of the services provided by electronic devices in today's interconnected world depend at least partly on electronic communications. Electronic communications can include those exchanged between or among distributed electronic devices using wireless or wired signals that are transmitted over one or more networks, such as the Internet or a cellular network. Electronic communications can also include those exchanged between or among different printed circuit boards, modules, chips, or even cores or other circuit portions of a given integrated circuit that are located within a housing of a single electronic device. Regardless, electronic communications are usually accomplished by generating or propagating electrical or electromagnetic signals. Such electronic communications are typically made using at least one signal that is designed to have a specified characteristic, such as a particular frequency. Generally, the signals of electronic communications are more likely to be correctly transmitted and received, as well as properly interpreted, if the specified characteristic is accurately and reliably produced.

With regard to a frequency signal characteristic, a frequency synthesizer can be used to create, or synthesize, a desired frequency. Thus, electronic devices employ frequency synthesizers to synthesize signals having desired frequencies. Typically, a frequency synthesizer includes a frequency generator, such as a phase-locked loop (PLL). In operation, a PLL receives a reference signal having a reference frequency and applies the reference signal to a feedback loop. Using the feedback loop, the circuitry of the PLL generates an output signal that oscillates at a desired frequency based at least on the reference frequency of the reference signal.

A PLL of an electronic device therefore outputs an oscillating signal having some synthesized frequency. The electronic device can use the synthesized frequency of the oscillating signal in one or more stages of a communication scenario. Example stages for communicating a signal include generating, transmitting, receiving, and interpreting a communication signal. In an example signal-generation stage, a frequency synthesized by a PLL can be used to modulate a communication signal. Here, the modulation entails encoding or adding information—such as a text and an associated photograph—to the communication signal. In an example signal-transmission stage, a frequency synthesized by a PLL can be employed to upconvert a frequency of a modulated communication signal using a mixer that is part of a transmit chain. With an up-conversion operation, the mixer increases a frequency of the communication signal. The increased frequency enables the communication signal to be transmitted wirelessly as a radio-frequency (RF) electromagnetic (EM) signal that propagates in free space, e.g., between a smartphone and a cellular base station.

A PLL can also be used with the stages of a reception side of a typical communication scenario. For example, a PLL can be used to down-convert a frequency of a received communication signal using a mixer that is part of a receive chain. After down-conversion, a PLL can be used to demodulate the down-converted communication signal to interpret the signal and thereby recover encoded information—such as the text message and the associated photograph. Additionally, a PLL can be used to produce a synthesized frequency for a clock signal that controls a rate of operation of clock-synchronized circuitry of an integrated circuit. Examples of such an integrated circuit include a system-on-chip (SoC), a modem baseband that processes a communication signal, and a graphics chip that processes video data that is being displayed to a user.

Thus, a PLL can be employed in any of multiple stages of a communication scenario to support electronic communications with electronic devices or in synchronously-operated circuitry to support coordinated interoperations among different components of electronic devices. However, a degree to which a PLL is stable and accurate and produces a clean synthesized frequency can vary. This variability can adversely impact the electronic communications or coordinated interoperations that are being supported by a PLL. Consequently, electrical engineers and other designers of electronic devices strive to improve the functionality, stability, and clean output frequency of PLLs that are used to facilitate the electronic communications and high-speed synchronous operations of electronic devices.

SUMMARY

A phase-locked loop (PLL) with multiple error determiners is disclosed herein. A PLL can include, for example, at least one error determiner, a loop filter, a voltage-controlled oscillator (VCO), and a feedback path. These components are coupled together to form a feedback loop of the PLL. Each error determiner of the multiple error determiners can include, for example, a phase-frequency detector (PFD) and a charge pump. Alternatively, an error determiner may be formed from a time-to-digital converter (TDC), a sampler, and so forth. The PLL produces an output signal that includes an output frequency and that is provided as an output of the VCO. The feedback path can include a frequency divider that receives a divider value as input. This divider value controls the output frequency of the output signal of the PLL using the feedback loop.

If the divider value includes a noise component, the noise component is injected into the PLL at the frequency divider via the feedback path. The noise component propagates around the feedback loop of the PLL and produces phase noise in the output frequency of the output signal. This phase noise impacts a purity of the output frequency and can adversely affect components that rely on the output frequency for electronic communications or clock-signal generation. Generally, reducing the noise component, which propagates around the feedback loop of the PLL and reaches the output signal at the VCO, can provide a cleaner output frequency that is synthesized for use by other components.

A PLL typically receives a reference signal as a "starting point" for producing the output frequency. The output frequency results from a product of the divider value and a reference frequency of the reference signal. Thus, the output frequency can take on frequencies that are multiples of the reference frequency with an integer frequency divider. It is sometimes desirable, however, to produce an output frequency that falls between two multiples of the reference frequency. To do so, a sigma-delta modulator (SDM or ΣΔ-modulator), for example, can be employed to rapidly change an integral divider value to achieve an average divider value that is between two integral dividers. This is referred to as a fractional-frequency divider value that is used to realize a "fractional-N" PLL. In other words, instead of being constrained to a 3× or 4× multiplier of a reference frequency with a PLL, a 3.4× or a 3.7× frequency multiplication can be achieved using fractional-frequency divider, such as with a sigma-delta modulator. Unfortunately, using a sigma-delta modulator may produce an appreciable noise component that is injected into the feedback loop by the frequency divider.

This injected noise can cause challenges in various environments. Some next-generation cellular networks will adhere to a 5th Generation (5G) New Radio (NR) standard that is promulgated by the 3rd Generation Partnership Project (3GPP). Generally, wireless networks that comport with 5G NR technologies will operate at higher frequencies and with lower latencies. These features will enable new services to be offered, such as the wireless delivery of 4K video, providing virtual reality (VR) over cellular networks, safer autonomous vehicles, real-time language translations, and so forth. Certain standards releases by the 3GPP for 5G NR, however, impose constraints on the phase noise that a PLL can exhibit. Meeting these phase noise constraints is especially challenging for signals at millimeter wave (mmWave) frequencies and/or while providing a fractional-frequency divider using a delta-sigma modulator (DSM). Accordingly, reducing the effects of a noise component at a frequency divider, for example as injected by a sigma-delta modulator, can enable a PLL to provide a cleaner synthesized frequency for use by other components to meet 5G NR phase noise constraints.

In example implementations, the effects of a noise component are moderated by a PLL that includes multiple error determiners. If each error determiner includes a phase-frequency detector and a charge pump, multiple parallel pairs of a phase-frequency detector and an associated charge pump are coupled along a feedback loop of the PLL. Each respective error determiner accepts as input, in addition to a reference signal, a respective feedback signal with a different noise component. Multiple feedback signals may be produced by a frequency divider of the feedback loop from multiple divider values, for example as created by multiple sigma-delta modulators or other modulators or sources of a divider value. Each divider value may have a different noise component, which can be uncorrelated with other such noise components. Consequently, each error determiner of the multiple error determiners is processing a version of a feedback signal with a different noise component. The multiple error determiners produce multiple error signals based on the reference signal and the multiple feedback signals with the different noise components. The PLL combines the multiple error signals into a combined error signal.

By combining the multiple error signals, the noise components are combined to "average" them together in a manner that reduces the noise level. This averaging therefore reduces a total noise component that is propagated around the feedback loop to the VCO. Accordingly, the output signal of the VCO, which serves as the output signal of the PLL, also has a lower noise component. The output frequency of the output signal therefore has a lower phase noise than the output frequency would have if the PLL did not employ the multiple error determiners to process the multiple feedback signals. In these manners, by using multiple error determiners, a PLL can be controlled so as to moderate a phase noise of an output frequency of the output signal of the PLL. As described herein, an analog PLL, a digital PLL, a sampling PLL, a combination thereof, and so forth may implement multiple error determiners to moderate the phase noise of the output frequency of the output signal. In some embodiments, the PLL is configured to output a signal having a mmW frequency and/or is configured for use with a fractional-frequency divider, which may use at least one delta-sigma modulator. In some such embodiments, the PLL is configured with such features while satisfying the requirements of a relevant communications standard, such as a 5G NR standard.

In an example aspect, an apparatus for generating a frequency is disclosed. The apparatus includes a phase-locked loop (PLL). The PLL includes a loop filter including a filter input node and a filter output node. The PLL also includes a voltage-controlled oscillator (VCO) including a VCO input node and a VCO output node. The VCO input node is coupled to the filter output node. The PLL additionally includes a frequency divider including a divider input node and multiple divider output nodes. The divider input node is coupled to the VCO output node. The PLL further includes multiple error determiners coupled between the multiple divider output nodes and the filter input node.

In an example aspect, an apparatus for generating a frequency that is used in the processing of signals for wireless communication is disclosed. The apparatus includes a phase-locked loop (PLL). The PLL includes oscillation means for producing an output signal of the phase-locked loop based on a filtered signal. The PLL also includes feedback means for dividing the output signal by at least one divider value to produce multiple feedback signals. The PLL additionally includes determination means for determining multiple error signals based on the multiple feedback signals and at least one reference signal. The PLL further includes filtration means for filtering the multiple error signals to produce the filtered signal.

In an example aspect, a method for operating a phase-locked loop (PLL) is disclosed. The method includes producing an output signal of the PLL based on a filtered signal. The method also includes dividing the output signal by at least one divider value to produce a core feedback signal and generating multiple feedback signals based on the core feedback signal. The method additionally includes determining multiple error signals based on the multiple feedback signals and at least one reference signal. The method further includes filtering the multiple error signals to produce the filtered signal.

DETAILED DESCRIPTION

Figure 1:
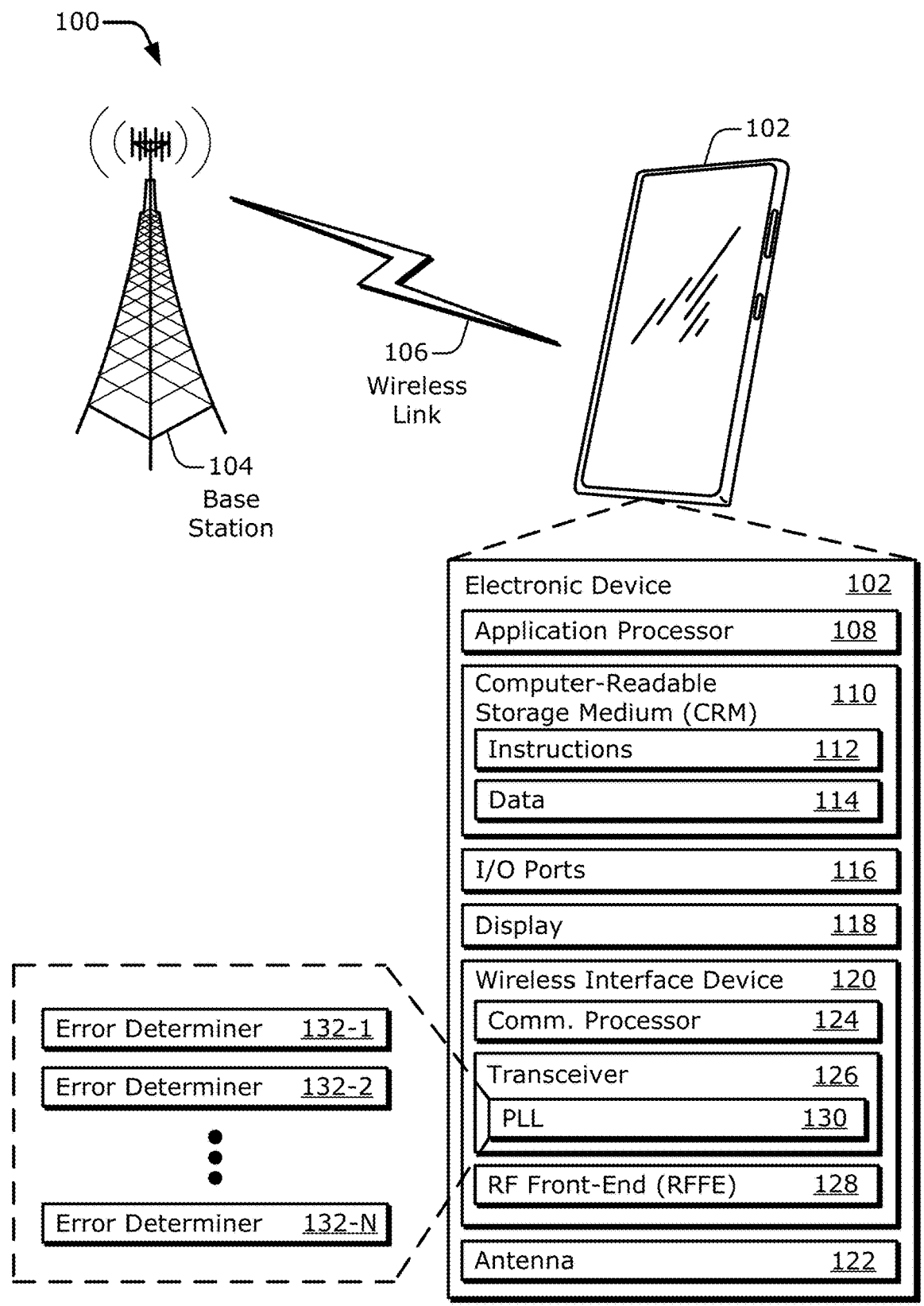
FIG. 1 illustrates an environment with an example electronic device including a wireless interface device, which includes a transceiver having a phase-locked loop (PLL) with multiple error determiners.

Generally, electronic communications are made using signals that oscillate at different frequencies. Electronic devices use various components to create signals having different signal characteristics, such as frequency synthesizers to generate signals having targeted oscillation frequencies. To do so, an oscillating signal is input to a feedback loop that produces a signal having a frequency characteristic that is generated to facilitate an electronic communication. In addition to enabling the production and processing of communication signals, frequency synthesizers are used to generate clock signals that control the timing of processing operations in integrated circuits, such as a central processing unit (CPU), a graphics processing unit (GPU), or a system-on-chip (SoC).

Thus, electronic devices use oscillating signals that rise and fall at some frequency, which frequency can be constant or can be changing responsive to a desired frequency modulation. For example, electronic devices can use oscillating signals to control a rate at which processing operations are performed, such as with a clock signal. Additionally or alternatively, electronic devices can use oscillating signals to facilitate transmission and reception of signals in different communication scenarios. For instance, oscillating signals can be used with mixers that perform frequency translations for up-conversion or down-conversion. Further, oscillating signals can be used to encode information by applying a frequency-based modulation to a signal.

These oscillating signals can be generated by a frequency synthesizer, which can include circuitry implementing some type of locked loop. The frequency synthesizer produces an output signal having a synthesized frequency that is based at least on a reference frequency of a reference signal and a divider value "D" (e.g., which can be derived from a user-selectable modulus value "M"). The divider value controls how much the frequency synthesizer changes, such as increases, the reference frequency to produce the synthesized frequency of the output signal. An example type of locked loop is a phase-locked loop (PLL). The accuracy and stability of PLL-based frequency synthesizers is partially contingent on performance of the underlying circuitry, such as a feedback loop of the PLL or the control circuitry of the PLL.

Noise, including phase noise, can adversely impact PLL performance by polluting an output frequency of an output signal of a PLL. Accordingly, phase noise may be constrained by applicable wireless communication standards to facilitate reliable wireless communications. For example, at mmWave frequencies, some 5G NR standards establish a maximum integrated phase noise (IPN) that is to be met by the PLL. Unfortunately, PLL operational characteristics can work at cross-purposes with regard to phase noise. On the one hand, to lower flicker noise (1/f) of a voltage-controlled oscillator (VCO) of the PLL, a bandwidth of the PLL may be widened. On the other hand, as the bandwidth of the PLL is widened, a level of overall IPN may increase, for example as caused by an associated delta-sigma modulator (DSM) or other generator of a frequency divider value. For example, in some environments, a contribution to an overall IPN that is caused by a DSM controlling the divider value of the PLL can increase appreciably after the PLL bandwidth exceeds one megahertz (MHz). In other words, attempting to improve noise in one aspect of the PLL (e.g., VCO flicker noise) can worsen noise originating from another aspect of the PLL (e.g., using fractional frequency division).

To address noise in the PLL (e.g., due to the competing noise sources identified above), described PLL implementations include multiple error determiners as part of a feedback loop. In an example PLL, the feedback loop includes multiple error determiners, a loop filter, a VCO, and a feedback path having a frequency divider. The VCO produces an output signal for the PLL based on a filtered signal. The frequency divider also accepts the output signal from the VCO. Based on the output signal, the frequency divider generates multiple feedback signals. Each feedback signal can include a different noise component that is uncorrelated with one another. Each respective error determiner of the multiple error determiners accepts a respective feedback signal of the multiple feedback signals and a reference signal. Each respective error determiner can use a phase-frequency detector and charge pump pair to compare the respective feedback signal and the reference signal to determine a respective error signal. Alternatively, error determiners that are each realized using, e.g., a time-to-digital converter (TDC) or a sampler can determine respective error signals.

Thus, each respective error determiner of the multiple error determiners determines a respective error signal of multiple error signals based on a respective feedback signal of the multiple feedback signals. Each error signal has a noise component that can be uncorrelated with the others. The PLL combines the multiple error signals to produce a combined error signal. The loop filter filters the combined error signal to provide the filtered signal to the VCO. By combining the multiple error signals to produce the combined error signal, the PLL reduces the noise component being propagated around the feedback loop of the PLL to the VCO. This reduces the phase noise in an output frequency of the output signal. Accordingly, in some embodiments, a wider PLL bandwidth, which can reduce VCO flicker noise and/or enable operation across wider bandwidth signals (such as may be necessary in certain communications standards), can be used. In some such embodiments, the PLL can be configured to operate with at least one DSM that is employed for fractional-frequency division.

For example, the frequency divider can include multiple delta-sigma modulators (DSMs) that each produce a divider value, which may be realized as a sequence of divider values over time. To achieve uncorrelated divider values, each DSM can be initialized with a different value. In operation, the frequency divider produces the multiple feedback signals to be uncorrelated using the multiple divider values created by the multiple DSMs. The frequency divider forwards the multiple feedback signals to the multiple error determiners, which utilize the uncorrelated noise components of the multiple feedback signals to reduce the overall phase noise. In some cases, doubling a quantity of error determiners (and divider value generators like DSMs) can reduce noise by 3 dB. For example, increasing a quantity of error determiners from one to two improves noise by 3 dB, and increasing a quantity of error determiners from one to four improves noise by 6 dB.

The frequency divider can operate with a single analog divider core. In embodiments including multiple DSMs, the DSMs can be fabricated using digital components such that deploying multiple DSMs does not add significantly to the area or power consumption of the PLL. Further, a size of each error determiner (e.g., a size of each charge pump thereof) can be reduced by a factor of a quantity of error determiners because a magnitude of the current can be likewise reduced by a factor of a quantity of divider value generators for each error determiner. For instance, if four error determiners and four DSMs are utilized, a size of each charge pump—and the current flowing through each—can be reduced by one-fourth. Accordingly, employing multiple error determiners does not appreciably increase a size or current draw of the error-determining part of the PLL.

Consequently, a bandwidth of the PLL can be widened to lower VCO flicker noise, including at mmWave frequencies. In these manners, more stringent IPN specifications for PLL circuits that are promulgated by, e.g., a 5G NR standard can be met. This is so even in configurations in which PLL operational characteristics such as VCO flicker noise and divider value generator noise operate at cross-purposes with each other.

FIG. 1 illustrates an example environment 100 with an electronic device 102 having a wireless interface device 120, which includes a transceiver 126 having a phase-locked loop 130 (PLL 130). As shown, the PLL 130 includes multiple error determiners 132-1, 132-2, . . . , 132-N. In the environment 100, the example electronic device 102 communicates with a base station 104 through a wireless link 106. In FIG. 1, the electronic device 102 is depicted as a smartphone.

The electronic device 102 may, however, be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line, another electronic device as described above generally, and so forth. Hence, the electronic device 102 may communicate with the base station 104 or another device via a wired connection, a wireless connection, or a combination thereof.

The wireless link 106 extends between the electronic device 102 and the base station 104. The wireless link 106 can include a downlink of data or control information communicated from the base station 104 to the electronic device 102 and an uplink of other data or control information communicated from the electronic device 102 to the base station 104. The wireless link 106 may be implemented using any suitable communication protocol or standard. Examples of such protocols and standards include a 3rd Generation Partnership Project (3GPP) Long-Term Evolution (LTE) standard, such as a 4th Generation (4G) or a 5th Generation (5G) cellular standard; an IEEE 802.11 standard, such as 802.11g, ac, ax, ad, aj, or ay (e.g., Wi-Fi 6 or WiGig®); an IEEE 802.16 standard (e.g., WiMAX™); a Bluetooth™ standard; and so forth. In some implementations, the wireless link 106 may provide power wirelessly, and the electronic device 102 or the base station 104 may comprise a power source.

As shown for some implementations, the electronic device 102 includes at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) or at least one display 118. The I/O ports 116 enable data exchanges or interaction with other devices, networks, or users. The I/O ports 116 may include serial ports (e.g., universal serial bus (USB) ports), parallel ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The wireless interface device 120 provides connectivity to respective networks and peer devices via a wireless link, which may be configured similar to or differently from the wireless link 106. Alternatively or additionally, the electronic device 102 may include a wired interface device, such as an Ethernet or fiber optic transceiver for communicating over a wired local area network (LAN), an intranet, or the Internet. The wireless interface device 120 may facilitate communication over any suitable type of wireless network, such as a wireless LAN (WLAN), wireless personal-area-network (PAN) (WPAN), peer-to-peer (P2P) network, mesh network, cellular network, wireless wide-area-network (WAN) (WWAN), and/or a navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like.

As shown, the wireless interface device 120 includes at least one communication processor 124, at least one transceiver 126, and at least one radio-frequency (RF) front-end 128 (RFFE 128). These components process data information, control information, and signals associated with communicating information for the electronic device 102 via the antenna 122. The communication processor 124 may be implemented as at least part of a system-on-chip (SoC), as a modem baseband processor, or as a baseband radio processor (BBP) that enables a digital communication interface for data, voice, messaging, or other applications of the electronic device 102. The communication processor 124 includes a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108 or the communication processor 124 can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include a memory (not separately shown) to store data and processor-executable instructions (e.g., code), such as a CRM 110.

The transceiver 126 can include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). The frequency translation can be accomplished using a mixer (not shown in FIG. 1) in conjunction with the PLL 130. Generally, the transceiver 126 includes filters, switches, amplifiers, mixers, and so forth for routing and conditioning signals that are transmitted or received via the antenna 122.

As shown, the transceiver 126 includes at least the PLL 130. Nonetheless, the transceiver 126 can include other components, such as an analog-to-digital converter (ADC) or a digital-to-analog converter (DAC). In operation, an ADC can convert from analog signals to digital signals, and a DAC can convert from digital signals to analog signals. An ADC or a DAC can be implemented as part of the communication processor 124, as part of the transceiver 126, or separately from both of them (e.g., as another part of an SoC or as part of the application processor 108).

Figure 2:
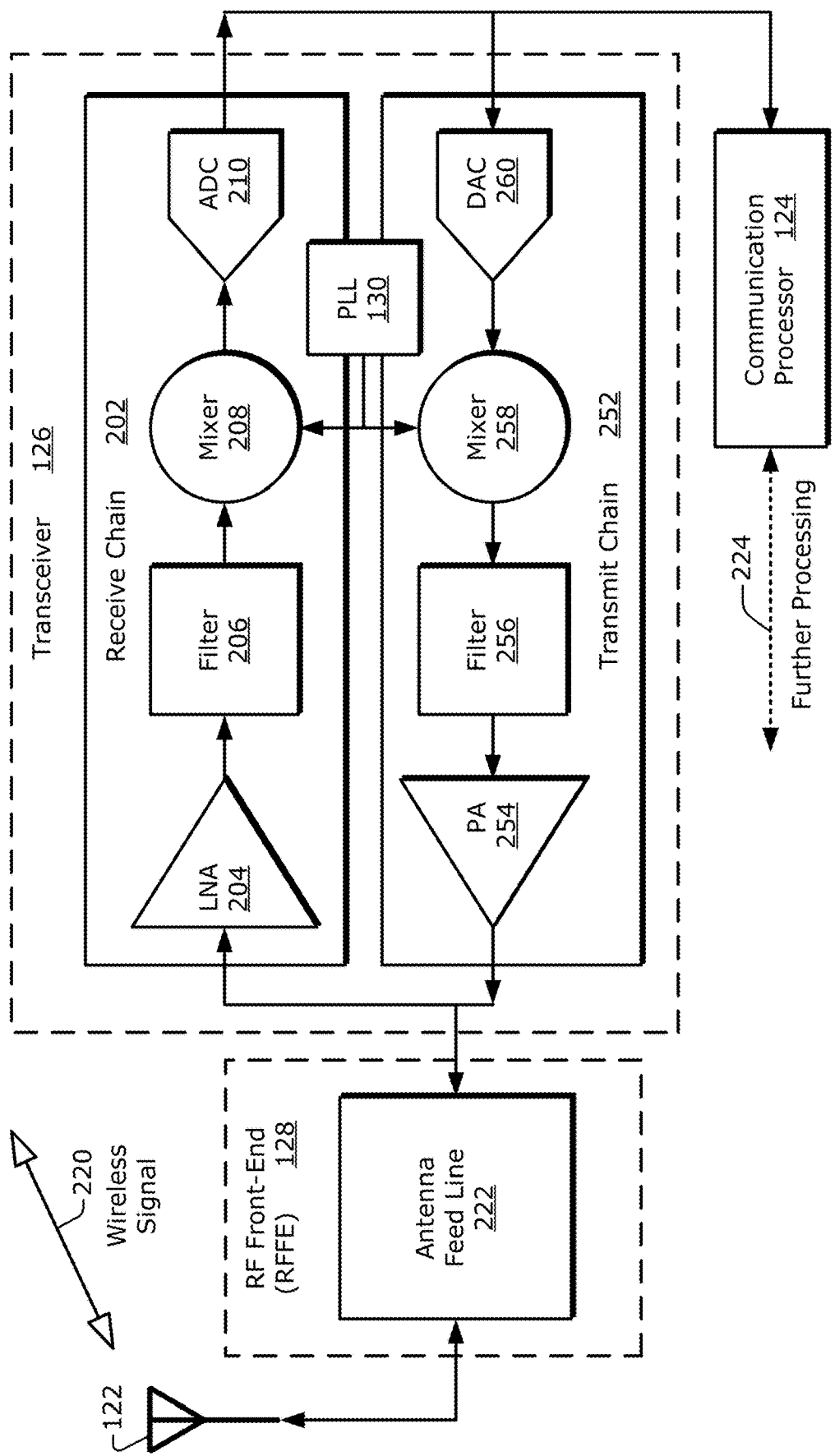
FIG. 2 illustrates an example transceiver that includes a PLL that can include multiple error determiners.

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

Generally, the RF front-end 128 includes one or more filters, switches, or amplifiers for conditioning signals received via the antenna 122 or signals to be transmitted via the antenna 122. The RF front-end 128 may include a phase shifter (PS), peak detector, power meter, gain control block, antenna tuning circuit, N-plexer, balun, and the like. Configurable components of the RF front-end 128, such as a phase shifter or automatic gain controller (AGC), may be controlled by the communication processor 124 to implement communications in various modes, with different frequency bands, or using beamforming. In some implementations, the antenna 122 is implemented as at least one antenna array that includes multiple antenna elements. Thus, as used herein, an "antenna" can refer to at least one discrete or independent antenna, to at least one antenna array that includes multiple antenna elements, or to a portion of an antenna array (e.g., an antenna element), depending on context or implementation.

In FIG. 1, the PLL 130 is depicted as being part of a transceiver 126. Described implementations of a PLL 130 can, however, additionally or alternatively be employed in other portions of the wireless interface device 120 (e.g., as part of the communication processor 124 or the RF front-end 128), or in other portions of the electronic device 102 generally (e.g., as a clock generator or other frequency synthesizer of the application processor 108 or an SoC). In example implementations, the PLL 130 includes multiple error determiners 132-1, 132-2, . . . , 132-N, with "N" representing a positive integer greater than one (e.g., two or more). Additional aspects of the wireless interface device 120, including with regard to the PLL 130, are described below with reference to FIG. 2. Example implementations of the PLL 130 are then described, starting with FIG. 3. The multiple error determiners 132-1 . . . 132-N of the PLL 130 are described further with reference to FIGS. 3, 5, and 6.

FIG. 2 illustrates, at 200 generally, an example transceiver 126 that includes a PLL 130 that can have multiple error determiners (not shown in FIG. 2). FIG. 2 further depicts the antenna 122, the RF front-end 128, and the communication processor 124. As illustrated from left to right, the antenna 122 is coupled to the RF front-end 128, and the RF front-end 128 is coupled to the transceiver 126. The transceiver 126 is coupled to the communication processor 124. The example RF front-end 128 includes at least one antenna feed line 222. The example transceiver 126 includes at least one receive chain 202 and at least one transmit chain 252. Although only one RF front-end 128, one transceiver 126, and one communication processor 124 are explicitly shown at 200, an electronic device 102, or a wireless interface device 120 thereof, can include multiple instances of any or all such components. Also, although only certain components are explicitly depicted in FIG. 2 and are shown coupled together in a particular manner, the transceiver 126 may include other non-illustrated components, more or fewer components, differently-coupled arrangements of components, and so forth.

In some implementations, the RF front-end 128 couples the antenna 122 to the transceiver 126 via the antenna feed line 222. In operation, the antenna feed line 222 propagates a signal between the antenna 122 and the transceiver 126. During or as part of the propagation, the antenna feed line 222 conditions the propagating signal. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2, an RF front-end 128, or an antenna feed line 222 thereof, may include one or more other components, such as a filter, an amplifier (e.g., a power amplifier or a low-noise amplifier), an N-plexer, a phase shifter, and so forth.

In some implementations, the transceiver 126 can include at least one receive chain 202, at least one transmit chain 252, or both at least one receive chain 202 and at least one transmit chain 252. The receive chain 202 includes a low-noise amplifier 204 (LNA 204), a filter 206, a mixer 208 for frequency down-conversion, and an ADC 210. The transmit chain 252 includes a power amplifier 254 (PA 254), a filter 256, a mixer 258 for frequency up-conversion, and a DAC 260. However, the receive chain 202 or the transmit chain 252 can include other components—such as additional amplifiers or filters, multiple mixers, one or more buffers, or at least one local oscillator—that are electrically disposed anywhere along the depicted receive and transmit chains. The receive chain 202 is coupled between the antenna feed line 222 of the RF front-end 128 and the communication processor 124, e.g., via the low-noise amplifier 204 and the ADC 210, respectively. The transmit chain 252 is coupled between the antenna feed line 222 and the communication processor 124, e.g., via the power amplifier 254 and the DAC 260, respectively. The transceiver 126 can also include at least one PLL 130, one PLL for each transmit/receive chain pair, one PLL per transmit chain and one PLL per receive chain, multiple PLLs, and so forth. In some implementations, a PLL 130 is implemented in the RF front-end 128 or coupled to the RF front-end 128 (e.g., to a mixer therein) instead of or in addition to being coupled to the receive chain 202 and/or the transmit chain 252 of the transceiver 126, or a separate PLL (which may be configured to operate similar to the PLL 130 as described in more detail below) is implemented in or coupled to the RF front-end 128.

As shown for the receive chain 202, the antenna 122 is coupled to the low-noise amplifier 204 via the antenna feed line 222, and the low-noise amplifier 204 is coupled to the filter 206. The filter 206 is coupled to the mixer 208, and the mixer 208 is coupled to the ADC 210. The ADC 210 is in turn coupled to the communication processor 124. As shown for the transmit chain 252, the communication processor 124 is coupled to the DAC 260, and the DAC 260 is coupled to the mixer 258. The mixer 258 is coupled to the filter 256, and the filter 256 is coupled to the power amplifier 254. The power amplifier 254 is coupled to the antenna 122 via the antenna feed line 222. Although only one receive chain 202 and one transmit chain 252 are explicitly shown, an electronic device 102, or a transceiver 126 thereof, can include multiple instances of either or both components.

An example signal-receiving operation that includes the receive chain 202 of the transceiver 126 is now described. As part of the signal-receiving operation, the antenna 122 receives a wireless signal 220. The antenna 122 can be implemented as an individual antenna, as an antenna array, as an antenna element of an antenna array, and so forth. The antenna 122 provides the wireless signal 220 to the RF front-end 128, and the RF front-end 128 uses the antenna feed line 222 to forward the corresponding wired signal to the transceiver 126. Thus, the antenna 122 provides the wireless signal 220 to the low-noise amplifier 204 of the receive chain 202 after conditioning or other signal manipulation by the antenna feed line 222. The low-noise amplifier 204 amplifies the manipulated signal to produce an amplified signal. The low-noise amplifier 204 provides the amplified signal to the filter 206. The filter 206 filters (e.g., low-pass filters or bandpass filters) the amplified signal by attenuating some range or ranges of frequencies to produce a filtered signal that has one or more frequency bands attenuated. The filter 206 provides the filtered signal to the mixer 208.

The mixer 208 performs a frequency conversion operation on the filtered signal to down-convert from one frequency to a lower frequency, such as from a radio frequency (RF) to an intermediate frequency (IF) or to a baseband frequency (BBF). The mixer 208, or multiple such mixers (which may be implemented in the transceiver 126 or distributed between the transceiver 126 and the RF front-end 128), can perform the frequency down-conversion in a single conversion step, or through multiple conversion steps, using at least one PLL 130 that generates a signal having a synthesized frequency. Thus, the mixer 208 accepts the filtered signal and performs a frequency down-conversion operation on the filtered signal to produce a down-converted signal; the mixer 208 also provides the down-converted signal to the ADC 210. The ADC 210 converts the analog down-converted signal to a digital signal. The ADC 210 provides the digital signal to the communication processor 124. The communication processor 124 can perform demodulation, decoding, and so forth on the digital signal to produce a data signal. The communication processor 124 then provides the data signal to other components, such as the application processor 108 (of FIG. 1), for further processing at 224 (e.g., for processing at an application level).

As part of an example signal-transmitting operation that includes the transmit chain 252, the DAC 260 accepts a digital signal from the communication processor 124. The DAC 260 converts the digital signal to an analog signal, which is at a baseband frequency (BBF) or an intermediate frequency (IF). The mixer 258 accepts the analog signal from the DAC 260. The mixer 258 upconverts the analog signal to a higher frequency, such as an RF frequency, to produce an RF signal using a signal generated by the PLL 130 to have a target synthesized frequency. The mixer 258 provides the RF signal to the filter 256. The filter 256 filters the RF signal to attenuate one or more frequency ranges and produces a filtered signal, which the filter 256 provides to the power amplifier 254. The power amplifier 254 amplifies the filtered signal to generate an amplified signal. The power amplifier 254 provides the amplified signal to the antenna feed line 222 for signal conditioning. The RF front-end 128 uses the antenna feed line 222 to provide the conditioned signal to the antenna 122 for emanation as another wireless signal 220. While the mixer 258 is described above as being implemented by the transceiver 126 for upconversion, a plurality of mixers for upconversion may be distributed between the transceiver 126 and the RF front-end 128. Further, each such upconversion mixer may be coupled to or implemented in combination with a PLL as described herein. Similarly, one or more other downconversion mixers, instead of or in addition to the mixer 208, may be implemented in the RF front-end 128. Each of such downconversion mixers may also be coupled to or implemented in combination with a PLL as described herein.

The PLL 130 is depicted in FIG. 2 as being part of a transceiver 126 to support frequency translation or modulation operations by a mixer of at least one transmit or receive chain. However, a PLL 130 can be deployed in other portions of an electronic device (e.g., in the RF front-end 128 or the application processor 108 (of FIG. 1)), used in other manners or to provide other functionality, coupled to different components (e.g., to a radar generator or a clock tree), and so forth. Examples of such functionality include radar signal generation, signal demodulation, clock multiplication, and the like.

Figure 3:
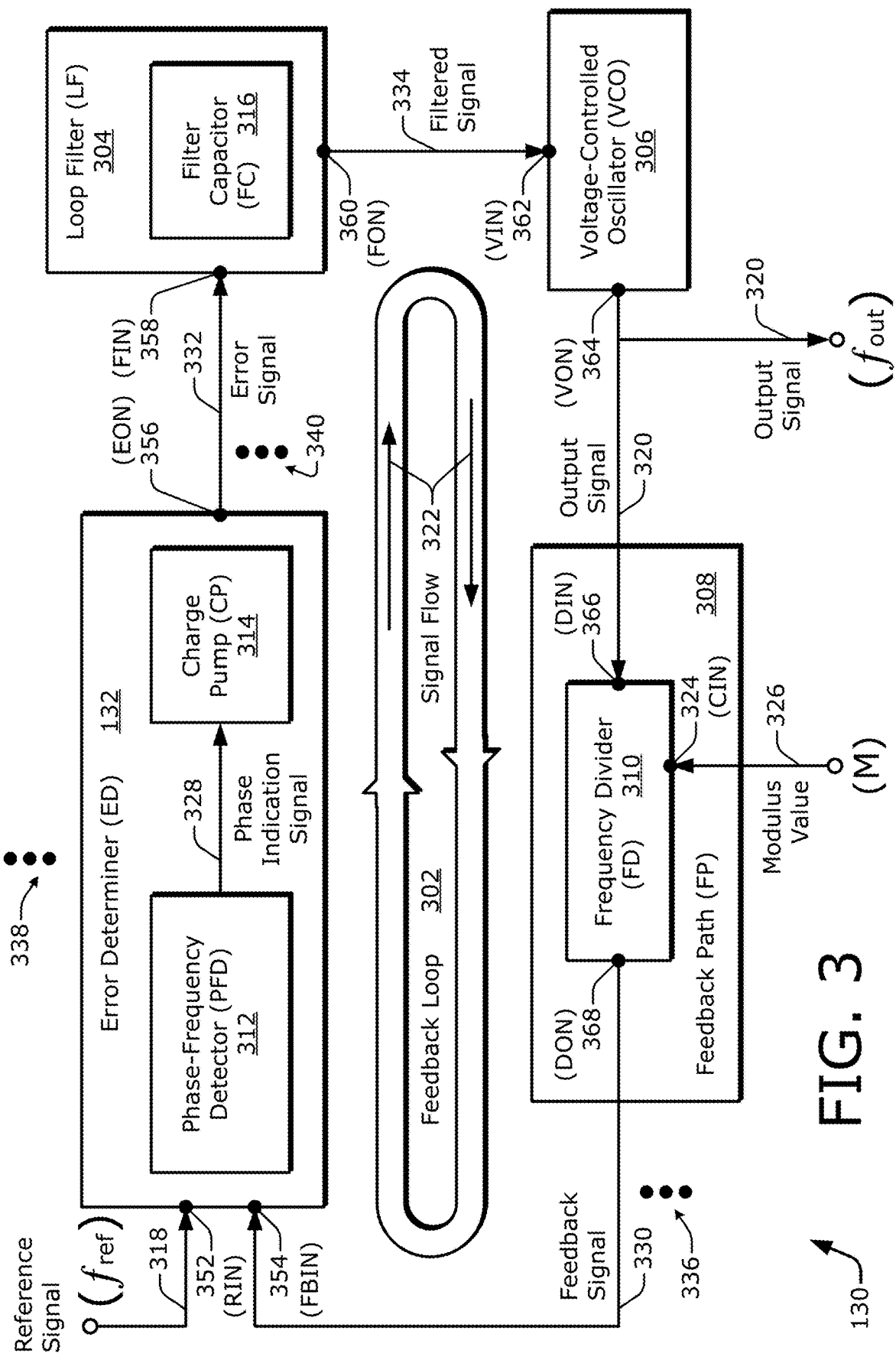
FIG. 3 illustrates an example PLL that includes at least one error determiner, a loop filter, a voltage-controlled oscillator (VCO), and a feedback path with a frequency divider.

FIG. 3 illustrates an example feedback loop 302 of a PLL 130. The PLL 130 includes multiple error determiners, a loop filter 304 (LF 304), a voltage-controlled oscillator 306 (VCO 306), and a feedback path 308 (FP 308) with a frequency divider 310 (FD 310). Although one error determiner 132 is explicitly depicted in FIG. 3 for clarity in describing certain operational principles of the PLL 130, the PLL 130 includes multiple error determiners 132-1, 132-2, . . . , 132-N (e.g., of FIGS. 1, 5, and 6) as indicated by the ellipsis 338 in FIG. 3. The feedback loop 302 therefore includes the error determiner 132 (ED 132), the loop filter 304, the VCO 306, and the frequency divider 310, which is part of the feedback path 308.

In some implementations, the error determiner 132 includes a phase-frequency detector 312 (PFD 312) and a charge pump 314 (CP 314). The loop filter 304 may include a filter capacitor 316 (FC 316). Thus, in an analog PLL 130, the error determiner 132 can include a phase-frequency detector 312 and a charge pump 314, and the loop filter 304 may be realized with at least one capacitor. Described implementations may, however, be implemented with different types of PLLs, such as a digital PLL, a sampling PLL, a sub-sampling PLL, and so forth. In a digital PLL 130, for instance, the error determiner 132 can include a time-to-digital converter (TDC), and the loop filter 304 can be realized with a digital filter. In a sampling PLL 130, the error determiner 132 can be realized as a sampler. In some cases, a sampler is implemented with a slope generator and a latch.

Certain example input and output signals and nodes of the PLL 130 are also indicated in FIG. 3. These include a reference signal 318 with a reference frequency $f_{ref}$ and an output signal 320 with an output frequency $f_{out}$. Further, a control input node 324 of the frequency divider 310 receives a modulus value 326 ("M"). Although not shown in FIG. 3, the frequency divider 310 can include at least one sigma-delta modulator (SDM) that operates responsive to the modulus value 326 "M".

The feedback loop 302 of the PLL 130 operates in accordance with a signal flow 322, which follows a clockwise direction as pictured in FIG. 3. In example implementations, the error determiner 132 is coupled to the loop filter 304. The loop filter 304 is coupled to the VCO 306, and the VCO 306 is coupled to the frequency divider 310. To close or complete a signal propagation path of the feedback loop 302, the frequency divider 310 is coupled to the error determiner 132. The feedback path 308 extends between the VCO 306 and the error determiner 132. As part of the error determiner 132 in some implementations, the phase-frequency detector 312 is coupled to the frequency divider 310. The phase-frequency detector 312 is also coupled to the charge pump 314, and the charge pump 314 is coupled to the loop filter 304 (e.g., to the filter capacitor 316 of the loop filter 304).

The error determiner 132 includes a reference input node 352 (RIN 352) and a feedback input node 354 (FBIN 354). The reference input node 352 accepts the reference signal 318. The error determiner 132 also includes an error output node 356 (EON 356). The loop filter 304 includes a filter input node 358 (FIN 358) and a filter output node 360 (FON 360). The error output node 356 is coupled to the filter input node 358. The VCO 306 includes a VCO input node 362 (VIN 362) and a VCO output node 364 (VON 364). The filter output node 360 is coupled to the VCO input node 362. The frequency divider 310 includes a divider input node 366 (DIN 366) and a divider output node 368 (DON 368). The VCO output node 364 is coupled to the divider input node 366, and the divider output node 368 is coupled to the feedback input node 354. Thus, the frequency divider 310 is coupled between the VCO output node 364 of the VCO 306 and the feedback input node 354 of the error determiner 132.

In example implementations, the feedback loop 302 of the PLL 130 utilizes a negative feedback path as part of the signal propagation loop. The following description of the feedback loop 302 starts at the top-left corner of FIG. 3 at the phase-frequency detector 312 and continues in a clockwise direction. The phase-frequency detector 312 accepts the reference signal 318 and a feedback signal 330. From the phase-frequency detector 312, signal flow of the feedback loop 302 continues to the charge pump 314. From the charge pump 314, the signal flow extends to the loop filter 304. More specifically, the error determiner 132 produces an error signal 332. Although one error signal 332 is explicitly depicted in FIG. 3 for clarity, the PLL 130 includes multiple error signals as indicated in FIG. 3 by the ellipsis 340. These multiple error signals are depicted explicitly in other drawings, such as FIGS. 5 and 6.

Continuing with the feedback loop 302, the loop filter 304 provides a filtered signal 334, which comprises a filtered version of the error signal 332, to the VCO 306. The VCO 306 produces the output signal 320 for the PLL 130 based on the filtered signal 334 that is accepted from the loop filter 304. The output signal 320 is also fed back to the phase-frequency detector 312 of the error determiner 132, via the frequency divider 310, as part of the feedback path 308 that includes the feedback signal 330. Although one feedback signal 330 is explicitly depicted in FIG. 3 for clarity, the PLL 130 includes multiple feedback signals as indicated in FIG. 3 by the ellipsis 336. These multiple feedback signals are depicted explicitly in other drawings, such as FIGS. 5, 7, and 10.

In an example operation, the phase-frequency detector 312 produces a phase-indication signal 328 based on a phase difference between the reference signal 318 and the feedback signal 330. The charge pump 314 accepts the phase-indication signal 328, which is indicative of the phase difference, and converts the phase-indication signal 328 to the error signal 332, which may be realized as at least one charge signal. The charge pump 314 of the error determiner 132 provides the error signal 332 to the loop filter 304 via the error output node 356 and the filter input node 358. Thus, the charge from the error signal 332 can be applied to the filter capacitor 316 of the loop filter 304. This applied charge can increase or decrease a voltage level associated with the filter capacitor 316. The voltage level of the filter capacitor 316 can serve as a voltage-based version of the filtered signal 334. In effect, the loop filter 304 uses the filter capacitor 316 to integrate the charge in the error signal 332 by charging the filter capacitor 316 (e.g., in which charging can include adding charge to or removing charge from the filter capacitor 316). The loop filter 304 can also perform lowpass filtering as part of the operation to generate the voltage-based filtered signal 334.

The loop filter 304 provides the filtered signal 334 to the VCO 306 via the filter output node 360 and the VCO input node 362. The VCO 306 functions as an oscillator having a frequency that is proportional to a magnitude or level of the filtered signal 334. Hence, the VCO 306 produces an oscillating signal as the output signal 320 based on the filtered signal 334 obtained from the loop filter 304. Thus, this oscillating signal can represent the output signal 320 of the PLL 130. This oscillating signal is also used to continue the feedback loop 302. Accordingly, the output signal 320 can be fed directly back to the phase-frequency detector 312 without modification in some PLL implementations (e.g., where the feedback signal 330 comprises an unmodified version of the output signal 320).

However, as illustrated in FIG. 3, the VCO 306 can instead provide the output signal 320 to the frequency divider 310 via the VCO output node 364 and the divider input node 366. The frequency divider 310 generates the feedback signal 330 based on the output signal 320 and the modulus value 326, which can be fixed or adjustable (e.g., can be user-programmable). The frequency divider 310 provides the feedback signal 330 to the phase-frequency detector 312 of the error determiner 132 via the divider output node 368 and the feedback input node 354 to complete the feedback loop 302 of the PLL 130. Example PLL implementations with multiple error determiners, and thus multiple instances of the feedback input node 354 and the error output node 356, are described further below with reference to FIGS. 5 and 6. However, example implementations of an error determiner 132 are described next with reference to FIG. 4.

Figure 4:
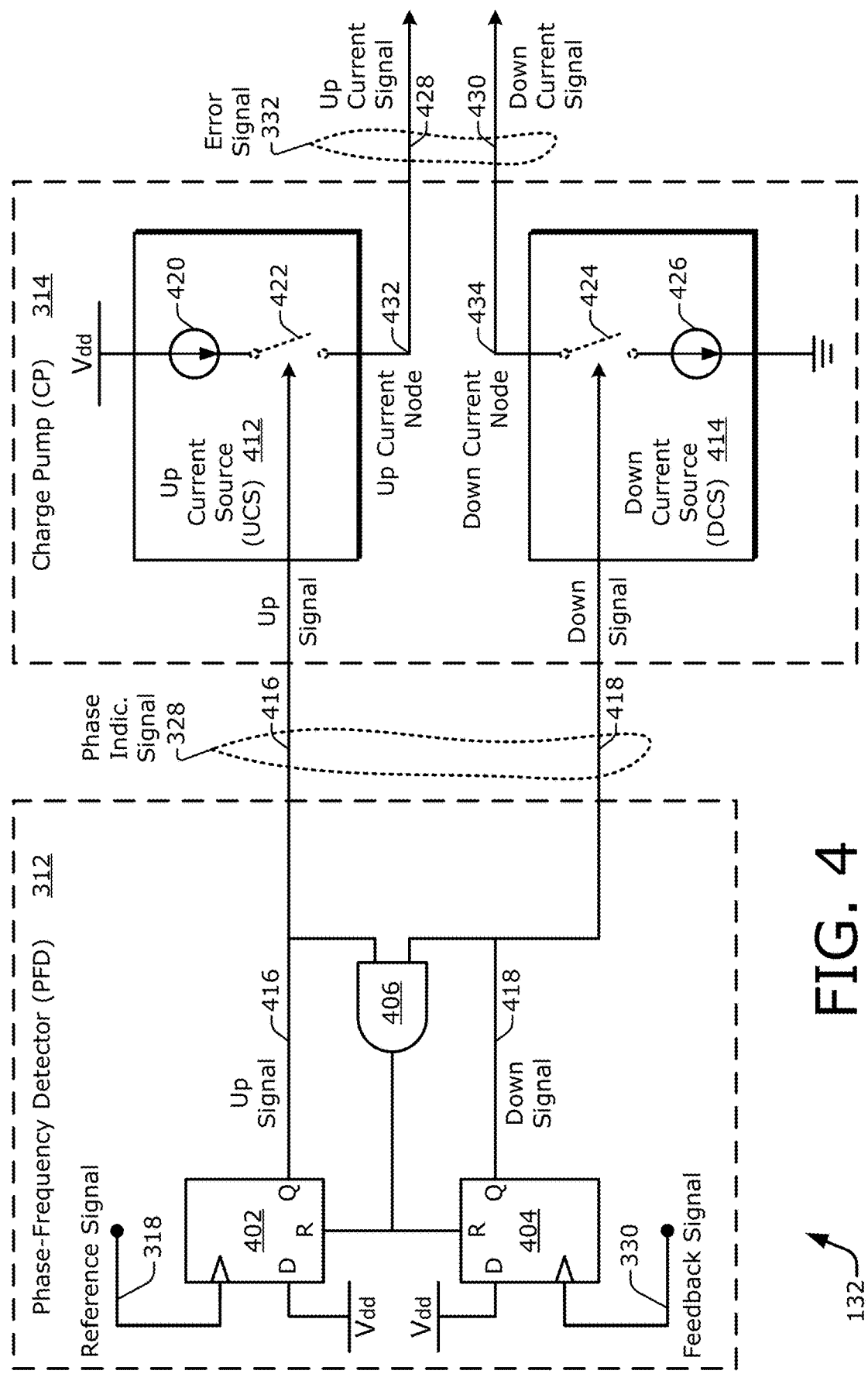
FIG. 4 illustrates an example error determiner that includes circuitry for a phase-frequency detector (PFD) and circuitry for a charge pump.

FIG. 4 illustrates an error determiner 132 that includes an example of circuitry for a phase-frequency detector 312 and an example of circuitry for a charge pump 314. As illustrated, the phase-frequency detector 312 includes an AND gate 406 and two "D" flip-flops, a flip-flop 402 and a flip-flop 404. Although not explicitly shown, the phase-frequency detector 312 can also include one or more buffers to provide the phase-indication signal 328 to the charge pump 314. Each D-type flip-flop in FIG. 4 includes a "D" input (D-input), a "Q" output (Q-output), a clocking input (">"), and a reset terminal (R). The AND gate 406 includes a first input, a second input, and an output.

The D-input of the flip-flop 402 is coupled to a source voltage (Vdd). The reference signal 318 is coupled to the clocking input of the flip-flop 402. The Q-output of the flip-flop 402 produces an up signal 416 that is provided to the charge pump 314 as part of the phase-indication signal 328, as indicated by the dashed-line loop in the middle of FIG. 4. The up signal 416 is also coupled to the first input of the AND gate 406. The output of the AND gate 406 is coupled to the reset terminal (R) of the flip-flop 402.

The D-input of the flip-flop 404 is coupled to the source voltage (Vdd). The feedback signal 330 is coupled to the clocking input of the flip-flop 404. The Q-output of the flip-flop 404 produces a down signal 418 that is provided to the charge pump 314 as another part of the phase-indication signal 328. The down signal 418 is also coupled to the second input of the AND gate 406. The output of the AND gate 406 is coupled to the reset terminal (R) of the flip-flop 404.

In operation, the two edge-triggered clocking inputs of the flip-flops 402 and 404 work in conjunction with the D-inputs and the reset terminals (R) of the two flip-flops. The flip-flops 402 and 404 use an "internal" feedback path that is internal to the phase-frequency detector 312. This internal feedback path includes the AND gate 406. When the reference signal 318 and the feedback signal 330 are both high, the previous rising edge of these two signals cause both the up signal 416 and the down signal 418 to be high because the D-inputs are tied high to the source voltage (Vdd). This causes the AND gate 406 to output a high signal, which acts as a reset signal that triggers the reset terminal (R) of each of the flip-flop 402 and the flip-flop 404.

Responsive to a rising edge of the reset signal at the respective reset terminal (R), the flip-flop 402 changes the corresponding Q-output to be low, and this causes the up signal 416 to have a low value. Similarly, the flip-flop 404 changes the corresponding Q-output to be low; thus, the down signal 418 has a low value responsive to a rising edge of the reset signal at the respective reset terminal (R) of the flip-flop 404. Whichever incoming signal, either the reference signal 318 or the feedback signal 330, goes high first, the signal at the Q-output of the corresponding flip-flop will likewise be driven high, either the up signal 416 or the down signal 418, respectively. This output signal will remain high until the other incoming signal goes high, thereby causing the AND gate 406 to trigger both the reset terminals (R).

The charge pump 314 includes an up current source 412 (UCS 412) and a down current source 414 (DCS 414). The up current source 412 and the down current source 414 are each coupled between a power distribution node and another respective node. Specifically, the up current source 412 is coupled between the source voltage (Vdd) and an up current node 432, and the down current source 414 is coupled between a down current node 434 and ground. However, the current sources may be arranged in alternative manners.

The up current source 412 includes a current source 420 and an up switch 422. The down current source 414 includes a current source 426 and a down switch 424. In the drawings, switches having an undefined state are depicted with small-dashed lines, as shown in FIG. 4. A state of the up switch 422 is controlled by the up signal 416. If the up signal 416 is e.g. high, the up switch 422 is closed. If the up switch 422 is closed, current from the current source 420 can flow from the up current node 432 (e.g., to the loop filter 304) as an up current signal 428. Analogously, a state of the down switch 424 is controlled by the down signal 418. If the down signal 418 is e.g. high, the down switch 424 is in a closed state. If the down switch 424 is in the closed state, current from the current source 426 can flow from the down current node 434 (e.g., away from the loop filter 304) as a down current signal 430.

Generally, during operation, the charge pump 314 can be pumping charge with respect to the filter capacitor 316 of the loop filter 304. In some implementations, the "up" current signal 428 refers to current that is to add charge to the filter capacitor 316 (of FIG. 3) and thereby increase the voltage potential across the filter capacitor 316. Conversely, the "down" current signal 430 refers to current that is to reduce the charge at the filter capacitor 316 and thereby decrease the voltage potential across the filter capacitor 316. However, these current signals can be defined differently. Also, although shown schematically as separate arrows, the up current signal 428 and the down current signal 430 may be implemented together on a single wire. In some such embodiments, the up current node 432 and the down current node 434 are coupled together.

Thus, the phase-indication signal 328, including the up signal 416 and the down signal 418, can control operation of the charge pump 314. The up signal 416 controls the up current signal 428 that flows from the up current node 432. The down signal 418 controls the down current signal 430 that flows from the down current node 434. The error signal 332, which is generated by the charge pump 314 and provided to the loop filter 304 (of FIG. 3), includes the up current signal 428 and the down current signal 430, as indicated by the dashed-line loop on the right of FIG. 4.

Each error determiner 132 of multiple error determiners in a PLL 130 can include circuitry like that of the phase-frequency detector 312 and/or the charge pump 314 of FIG. 4. However, an error determiner 132 can be implemented using alternative circuitry. For example, an error determiner 132 may be implemented using a time-to-digital converter (TDC), a sampler, and so forth. Further, different error determiners of a given PLL 130 can include different circuit components or have different arrangements thereof relative to other error determiners of the given PLL. An example PLL 130 with multiple error determiners is described next with reference to FIG. 5.

Figure 5:
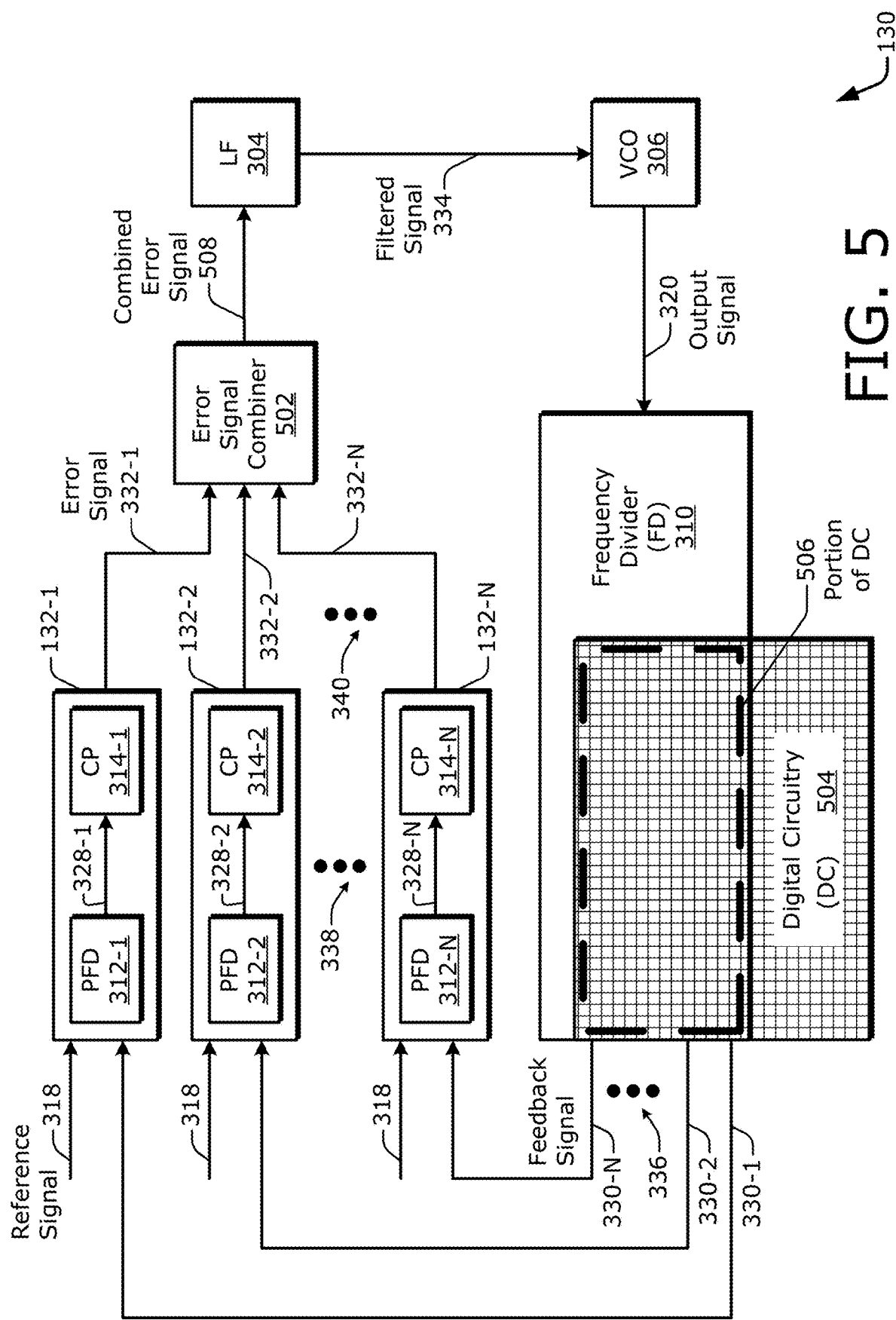
FIG. 5 illustrates another example PLL, which includes multiple error determiners, an error signal combiner, the loop filter, the VCO, and the frequency divider, which may include a portion of digital circuitry.

FIG. 5 illustrates another example PLL 130 that includes multiple error determiners 132-1 . . . 132-N, an error signal combiner 502, the loop filter 304, the VCO 306, and the frequency divider 310, which may include a portion of digital circuitry 506 (portion of DC 506). In comparison to the example PLL 130 of FIG. 3, the example PLL 130 of FIG. 5 also explicitly depicts the multiple error determiners 132-1 . . . 132-N, the error signal combiner 502, and the portion of digital circuitry 506. For the illustrated example, each respective error determiner 132 of the multiple error determiners 132-1 . . . 132-N includes a respective phase-frequency detector 312 of multiple phase-frequency detectors 312-1 . . . 312-N and a respective charge pump 314 of multiple charge pumps 314-1 . . . 314-N. Further, each respective phase-frequency detector 312 of multiple phase-frequency detectors 312-1 . . . 312-N produces a respective phase-indication signal 328 of multiple phase-indication signals 328-1 . . . 328-N. Thus, an error determiner 132-2 includes a phase-frequency detector 312-2 and a charge pump 314-2, and the phase-frequency detector 312-2 produces a phase-indication signal 328-2. FIG. 5 also illustrates the digital circuitry 504 (DC 504), which includes the portion of digital circuitry 506 as indicated by the thick dashed lines within the frequency divider 310.

As shown, the portion of digital circuitry 506 is therefore part of the digital circuitry 504. Generally, an integrated circuit can include analog components and digital components. In some cases, at least part of the digital components are organized together on the integrated circuit as the digital circuitry 504. From a macroscopic viewpoint, the digital circuitry 504 appears as relatively orderly arrangement of components (e.g., transistors) and lines (e.g., wires). The components fabricated in the digital circuitry 504 may be designed using, for instance, a library of components. The digital circuitry 504 can therefore have a grid-like appearance, which is represented graphically as cross-hatching in FIG. 5. In contrast, analog components may be larger or may have a more diverse arrangement or macroscopic appearance. As shown in FIG. 5, at least part of the frequency divider 310 may be realized using the digital circuitry 504, which is indicated as the portion of digital circuitry 506. This portion is described further below with reference to FIG. 7. Other components of the PLL 130, such as the multiple error determiners 132-1 . . . 132-N, the loop filter 304, or the VCO 306, may be implemented at least partly with analog components.

In example implementations, the PLL 130 includes multiple feedback signals 330-1, 330-2, . . . , 330-N, as represented by the ellipsis 336. The PLL 130 also includes the multiple error determiners 132-1 . . . 132-N, as represented by the ellipsis 338, and multiple error signals 332-1, 332-2, . . . , 332-N, as represented by the ellipsis 340. Each respective error determiner 132 of the multiple error determiners 132-1 . . . 132-N may include a respective phase-frequency detector 312 and a respective charge pump 314, examples of which are described above with reference to FIG. 4. Each respective error determiner 132 of the multiple error determiners 132-1 . . . 132-N accepts at least one reference signal 318 and a respective feedback signal 330 of the multiple feedback signals 330-1 . . . 330-N. Each respective error determiner 132 of the multiple error determiners 132-1 . . . 132-N produces a respective error signal 332 of the multiple error signals 332-1 . . . 332-N based on a difference between the reference signal 318 and the respective feedback signal 330 of the multiple feedback signals 330-1 . . . 330-N.

The error signal combiner 502 is coupled between the multiple error determiners 132-1 . . . 132-N and the loop filter 304. The error signal combiner 502 accepts the multiple error signals 332-1 . . . 332-N from the multiple error determiners 132-1 . . . 132-N. Based on the multiple error signals 332-1 . . . 332-N, the error signal combiner 502 produces a combined error signal 508. The combined error signal 508 therefore reflects, at least in part, each error signal 332 of the multiple error signals 332-1 . . . 332-N. The error signal combiner 502 provides the combined error signal 508 to the loop filter 304. The loop filter 304 therefore accepts the combined error signal 508 from the error signal combiner 502. Responsive to the combined error signal 508, which is based on the multiple error signals 332-1 . . . 332-N, the loop filter 304 produces the filtered signal 334.

Based on the filtered signal 334, the VCO 306 generates the output signal 320 and provides the output signal 320 to the frequency divider 310. The frequency divider 310 accepts the output signal 320 from the VCO 306. The frequency divider 310 includes analog and digital portions. Responsive to the output signal 320, the frequency divider 310 may use the portion of digital circuitry 506 to produce the multiple feedback signals 330-1 . . . 330-N. As described below with reference to FIGS. 7 and 8, the portion of digital circuitry 506 can include multiple delta-sigma modulators that are used to produce the multiple feedback signals 330-1 . . . 330-N. Next, however, additional aspects of the multiple error determiners 132-1 . . . 132-N, the error signal combiner 502, and the loop filter 304 are described with reference to FIG. 6.

Figure 6:
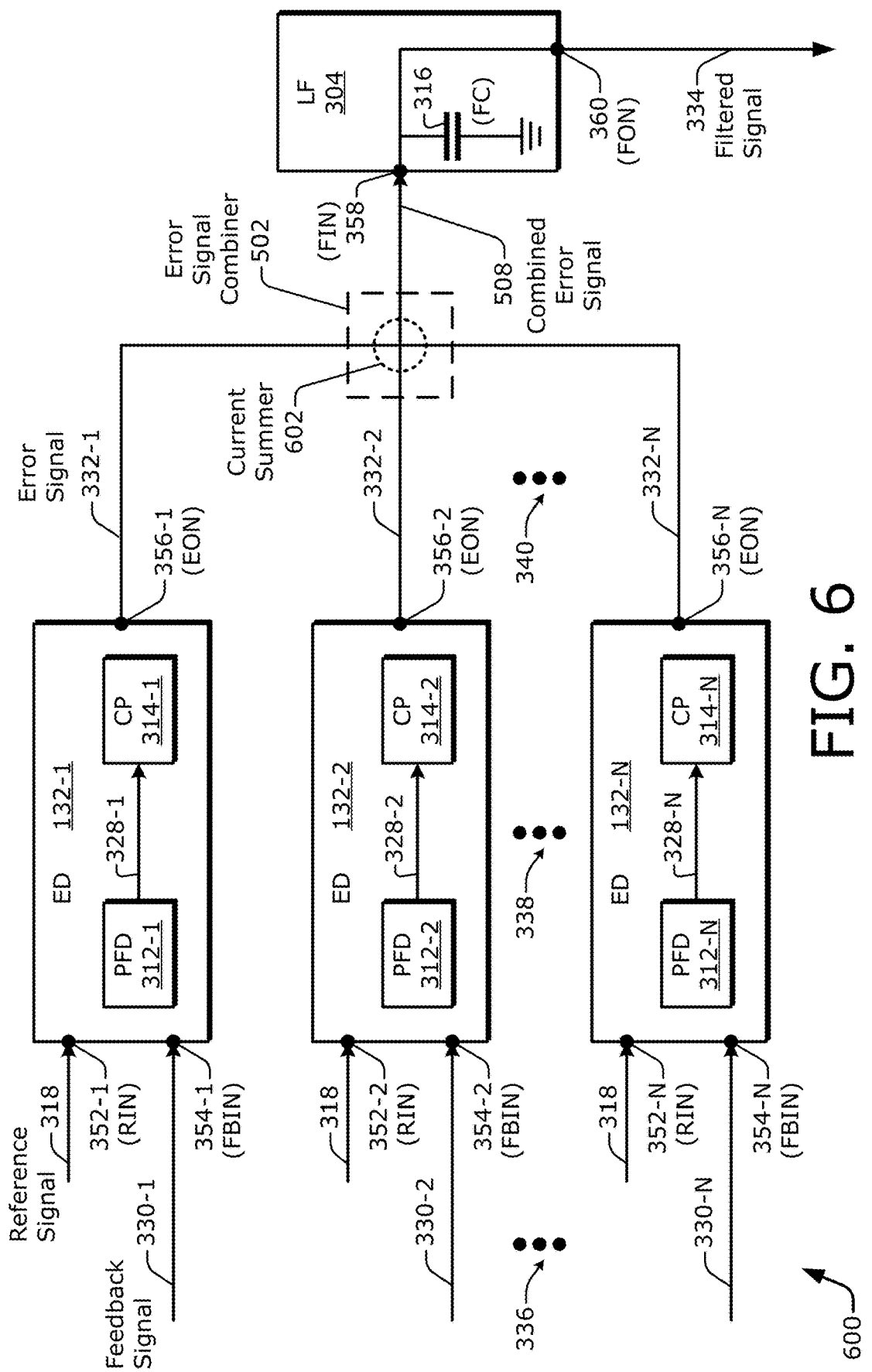
FIG. 6 is an example schematic diagram illustrating multiple error determiners, the error signal combiner, and the loop filter of a PLL to process multiple feedback signals.

FIG. 6 is an example schematic diagram 600 illustrating multiple error determiners 132-1 . . . 132-N, the error signal combiner 502, and the loop filter 304 of a PLL 130 to process multiple feedback signals 330-1 . . . 330-N. Each respective error determiner 132 of the multiple error determiners 132-1 . . . 132-N includes a respective reference input node 352 of multiple reference input nodes 352-1, 352-2, . . . , 352-N. Each respective error determiner 132 of the multiple error determiners 132-1 . . . 132-N accepts the reference signal 318 via the respective reference input node 352 of the multiple reference input nodes 352-1 . . . 352-N. Each respective error determiner 132 of the multiple error determiners 132-1 . . . 132-N includes a respective feedback input node 354 of multiple feedback input nodes 354-1, 354-2, . . . , 354-N. Each respective error determiner 132 of the multiple error determiners 132-1 . . . 132-N accepts a respective feedback signal 330 of the multiple feedback signals 330-1 . . . 330-N via the respective feedback input node 354 of the multiple feedback input nodes 354-1 . . . 354-N.

In example operations, the respective phase-frequency detector 312 of each respective error determiner 132 determines a respective phase-indication signal 328 based on the reference signal 318 and a respective feedback signal 330. The respective charge pump 314 produces a respective error signal 332 based on the respective phase-indication signal 328. Because the total current is divided by "N" (where "N" represents a quantity of error determiners), each charge pump 314 can be 1/N a size that a single charge pump would be if the PLL were implemented with a single error determiner 132. Each respective error determiner 132 of the multiple error determiners 132-1 . . . 132-N includes a respective error output node 356 of multiple error output nodes 356-1, 356-2, . . . , 356-N. In operation, each respective error determiner 132 of the multiple error determiners 132-1 . . . 132-N provides a respective error signal 332 of the multiple error signals 332-1 . . . 332-N via the respective error output node 356 of the multiple error output nodes 356-1 . . . 356-N.

In example implementations, the error signal combiner 502 is realized as a current summer 602. As shown, the current summer 602 may be implemented as a node to which the multiple error signals 332-1 . . . 332-N are routed. In operation, the current summer 602 sums the currents of the multiple error signals 332-1 . . . 332-N to combine them. The current summing can include, for instance, summing one or more positive currents and/or one or more negative currents to increase charge and/or decrease charge that is being applied to the loop filter 304 via the filter input node 358. If a current summer 602 realization of the error signal combiner 502 is implemented as at least one node, the at least one node may be disposed anywhere along an electrical path between the multiple error determiners 132-1 . . . 132-N and the loop filter 304 (e.g., anywhere between the multiple error output nodes 356-1 . . . 356-N and the filter input node 358). For example, the current summer 602 can be implemented as a node that is coupled to, that comprises, or that is electrically equivalent to a terminal of the filter capacitor 316 that is opposite another terminal thereof that is coupled to a ground. Thus, the error signal combiner 502 can be implemented by connecting together the multiple error output nodes 356-1 . . . 356-N to the loop filter 304, or at the loop filter 304. In such cases, the currents output by the charge pump 314 of each error determiner 132 of the multiple error determiners 132-1 . . . 132-N can combine and average appropriately to realize the combined error signal 508 for filtration by the loop filter 304. Accordingly, the error signal combiner 502 can produce the combined error signal 508 based on the multiple error signals 332-1 . . . 332-N. Nonetheless, the error signal combiner 502, or the operation thereof, can be implemented in alternative manners.

The error signal combiner 502 provides the combined error signal 508 to the loop filter 304. The loop filter 304 therefore accepts the combined error signal 508 via the filter input node 358. In some cases, the loop filter 304 includes at least one filter capacitor 316 that is coupled between the filter input node 358 and a ground. Thus, the filter capacitor 316 can be charged responsive to the combined error signal 508. Accordingly, the loop filter 304 can produce the filtered signal 334 based on the combined error signal 508. As described above with reference to FIGS. 3 and 5, the VCO 306 produces the output signal 320 based on the filtered signal 334. Operation of the frequency divider 310, which is based on the output signal 320, is described next with reference to FIG. 7.

Figure 7:
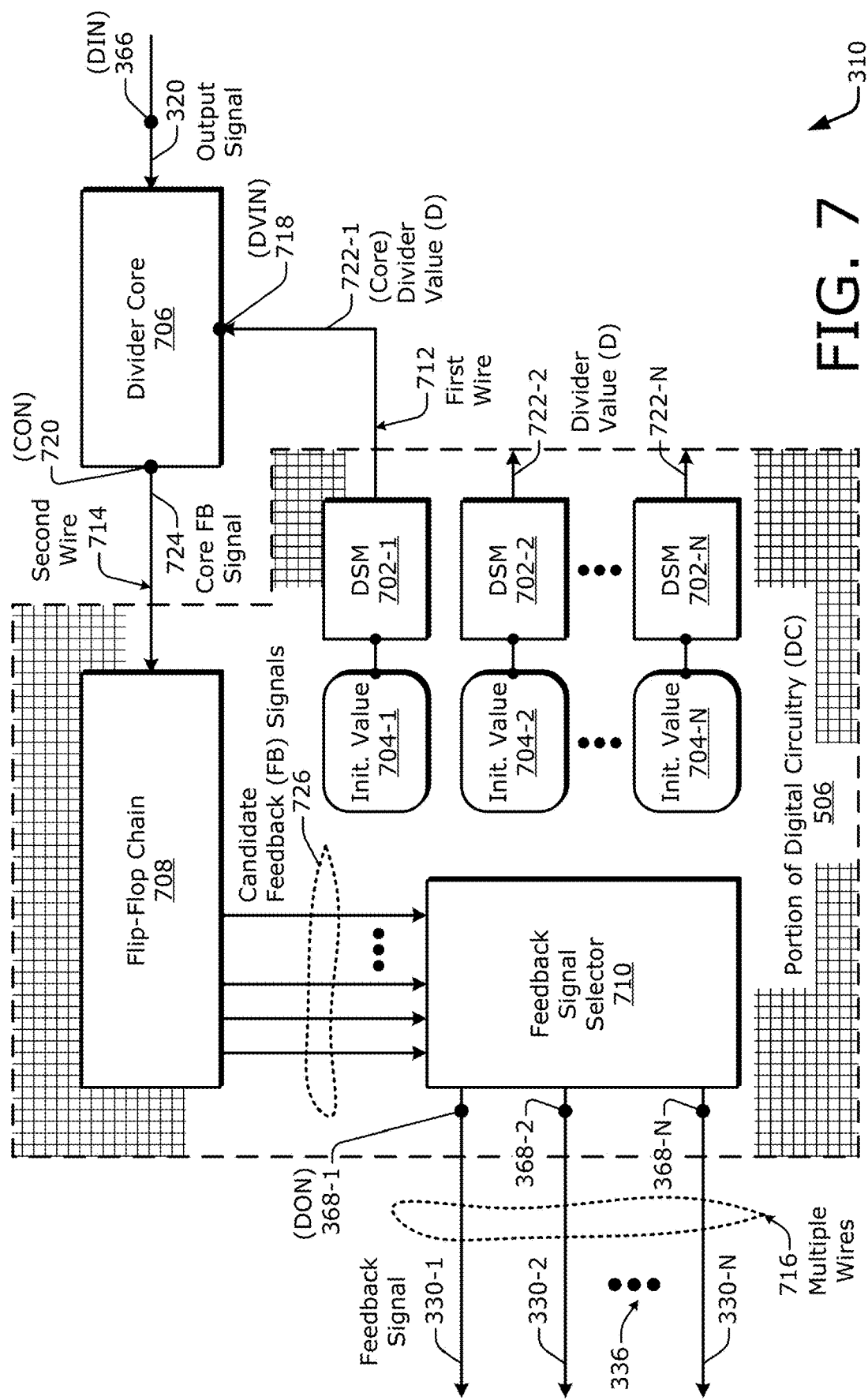
FIG. 7 illustrates an example frequency divider including a divider core, a flip-flop chain, a feedback signal selector, and at least one delta-sigma modulator (DSM).

FIG. 7 illustrates an example frequency divider 310 including a divider core 706, a flip-flop chain 708, a feedback signal selector 710, and at least one delta-sigma modulator 702 (DSM 702). As shown in FIG. 7, the frequency divider 310 can include both analog components and digital components. In example implementations, the divider core 706 is implemented as an analog component, but the other illustrated components are implemented digitally as indicated by the portion of digital circuitry 506. A first wire 712 extends between the portion of digital circuitry 506 and the divider core 706, and a second wire 714 extends between the divider core 706 and the portion of digital circuitry 506. Additionally, multiple wires 716 extend between the portion of digital circuitry 506 and the multiple error determiners 132-1 . . . 132-N (e.g., of FIGS. 5 and 6) to carry the multiple feedback signals 330-1 . . . 330-N. Each wire may be implemented using, for example, a metallic trace, a coplanar waveguide (CPW) transmission line, a microstrip (MSL) transmission line, a conductive line, and so forth. The wires and the illustrated components of the frequency divider 310 may, however, be implemented in different manners.

The divider core 706 includes a divider value input node 718 (DVIN 718), which is coupled to the first wire 712, and a core output node 720 (CON 720), which is coupled to the second wire 714. The divider core 706 may also include a core input node (not explicitly shown) that is coupled to, or electrically equivalent to, the divider input node 366 of the frequency divider 310 (e.g., as depicted in FIG. 3 as well as in FIG. 7). In operation, the divider core 706 produces a core feedback signal 724 (core FB signal 724) on the second wire 714 based on the output signal 320 and responsive to a divider value 722-1 ("D") that is received via the first wire 712. For example, the divider core 706 can divide an output frequency of the output signal 320 by the divider value 722-1 to produce a core frequency of the core feedback signal 724. The divider core 706 provides the core feedback signal 724 to the flip-flop chain 708 via the second wire 714.

To generate the multiple feedback signals 330-1 . . . 330-N, the digital components of the frequency divider 310 produce multiple candidate feedback signals 726, which production is described below with reference to FIGS. 8 and 9. As part of this technique, the flip-flop chain 708 produces the multiple candidate feedback signals 726 by delaying the core feedback signal 724 using "chain flip-flops" that are coupled together in series into a chained arrangement. The flip-flop chain 708 forwards the multiple candidate feedback signals 726 to the feedback signal selector 710. The feedback signal selector 710 includes multiple divider output nodes 368-1, 368-2, . . . , 368-N, which correspond to the divider output node 368 (e.g., of FIG. 3). In operation, the feedback signal selector 710 produces a respective feedback signal 330 of the multiple feedback signals 330-1 . . . 330-N on each respective divider output node 368 of the multiple divider output nodes 368-1 . . . 368-N. Here, each respective divider output node 368 of the multiple divider output nodes 368-1 . . . 368-N corresponds to a respective wire of the multiple wires 716. The feedback signal selector 710 selects from among the multiple candidate feedback signals 726 to produce the multiple feedback signals 330-1 . . . 330-N based on outputs of the delta-sigma modulators, which selection is described further with reference to FIGS. 8 and 10.

The portion of digital circuitry 506 includes multiple delta-sigma modulators 702-1, 702-2, . . . , 702-N, where "N" represents a positive integer. In this document, each instance of the variable "N" can take the same positive integer or different positive integers. Thus, a quantity "N" of the multiple DSMs 702-1 . . . 702-N may be the same as or different from a quantity "N" of the multiple error determiners 132-1 . . . 132-N. The portion of digital circuitry 506 also includes multiple registers. Each respective register of the multiple registers stores a respective initialization value 704. As shown, multiple initialization values 704-1, 704-2, . . . , 704-N are stored in "N" registers. Each respective initialization value 704 of the multiple initialization values 704-1 . . . 704-N corresponds to a respective DSM 702 of the multiple DSMs 702-1 . . . 702-N. In operation, each DSM 702 of the multiple DSMs 702-1 . . . 702-N produces a divider value 722 of multiple divider values 722-1, 722-2, . . . 722-N. Each respective DSM 702 provides a respective divider value 722 via a respective DSM output. Because the "first" divider value 722-1 is provided to the divider core 706, this divider value is also referred to herein as the core divider value 722-1. The multiple other divider values 722-2 . . . 722-N may be used internally within the portion of digital circuitry 506, which use is described with reference to FIGS. 8 and 10. Operation of the multiple DSMs 702-1 . . . 702-N are also described next with reference to FIG. 8.

Figure 8:
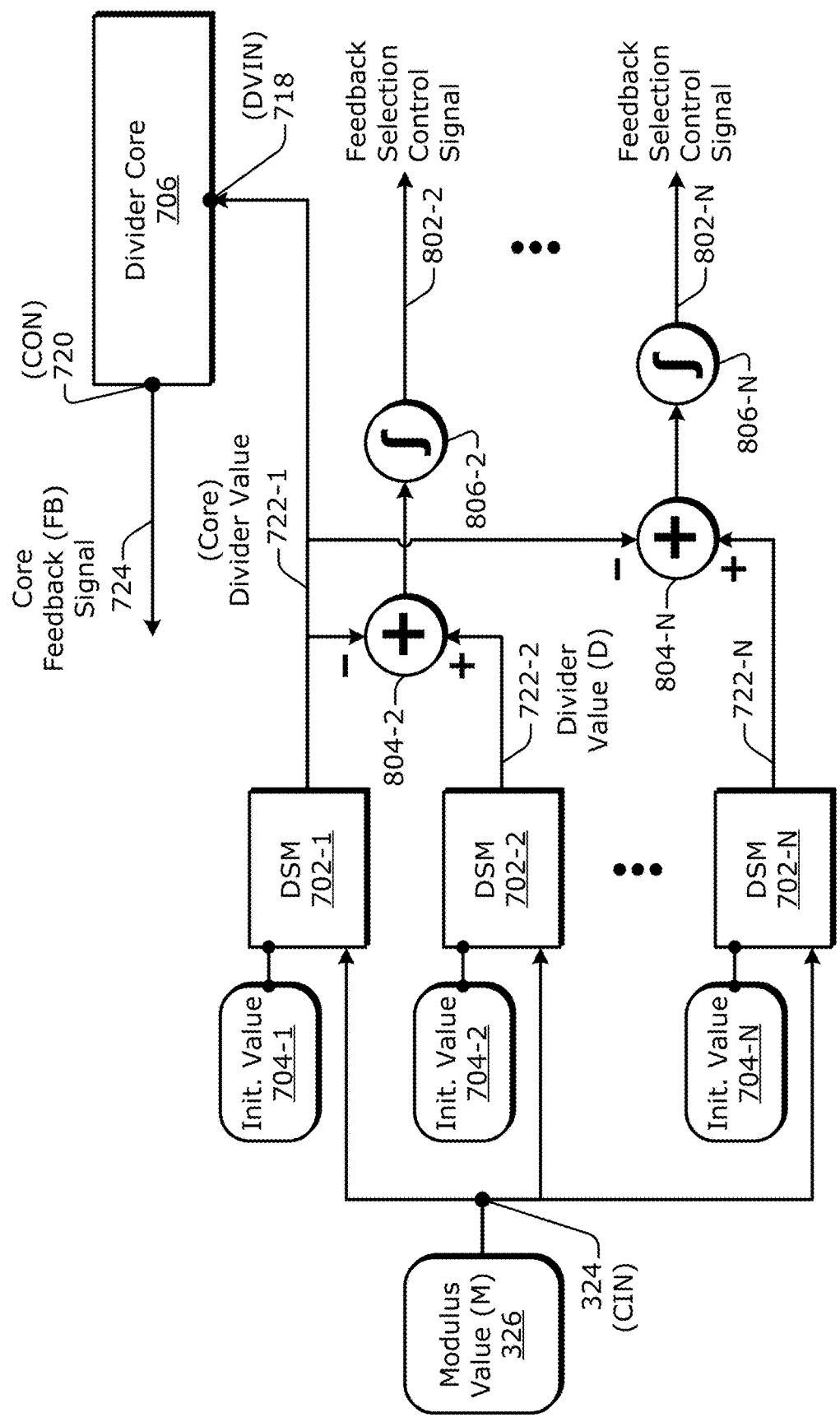
FIG. 8 is an example schematic diagram illustrating multiple delta-sigma modulators (DSMs), the divider core, and an example computation scheme for feedback selection control signals usable with the frequency divider of FIG. 7.

FIG. 8 is an example schematic diagram 800 illustrating multiple delta-sigma modulators (DSMs) 702-1 . . . 702-N, the divider core 706, and an example computation scheme for feedback selection control signals. A PLL 130 can employ a DSM to realize a fractional-frequency-divider operation with lower added phase noise and reduced fractional spurs as compared to a non-DSM-based fractional-frequency-divider operation. As described herein, using multiple DSMs in conjunction with multiple error determiners can further improve the phase noise. Each respective DSM 702 operates based on a modulus value 326 ("M") and a respective initialization value 704. Thus, each DSM 702 of the multiple DSMs 702-1 . . . 702-N operates based on a respective initialization value 704 of the multiple initialization values 704-1 . . . 704-N and a common or same modulus value 326.

Each DSM can be realized using, by way of example only, a third-order Mash 1-1-1 design. Alternative DSM designs or orders, however, can be implemented instead. Each respective initialization value 704 can be provided to establish, for instance, a different initial state for a first integrator of each respective DSM 702. Uncorrelation can be achieved by using different values for each initialization value 704.

The first DSM 702-1 produces the first divider value 722-1. Being the core divider value 722-1, the first DSM 702-1 provides the first divider value 722-1 to the divider core 706 via the divider value input node 718. The signal-computation scheme as illustrated in FIG. 8 produces multiple feedback (FB) selection control signals, such as feedback selection control signals 802-2 . . . 802-N. As described below with reference to FIG. 10, the feedback signal selector 710 (also of FIG. 7) uses the multiple feedback selection control signals 802-2 . . . 802-N to select the multiple feedback signals 330-1 . . . 330-N from among the multiple candidate feedback signals 726.

The portion of digital circuitry 506 of the frequency divider 310 (of FIG. 5) computes the multiple feedback selection control signals 802-2 . . . 802-N using the multiple divider values 722-1 . . . 722-N. Each respective feedback selection control signal 802 of the multiple feedback selection control signals 802-2 . . . 802-N is computed using the core or first divider value 722-1 and a respective divider value 722 of multiple divider values 722-2 . . . 722-N. Generally, the first divider value 722-1 is compared to a respective divider value 722 of multiple divider values 722-2 . . . 722-N across multiple comparison operations. For example, the feedback selection control signal 802-2 is computed based on a difference between the first divider value 722-1 and the second divider value 722-2 using a difference unit 804-2. This difference is integrated over time using an integration unit 806-2 to produce the corresponding feedback selection control signal 802-2. Generally, the "Nth" feedback selection control signal 802-N is computed based on another difference between the first divider value 722-1 and the "Nth" divider value 722-N using another difference unit 804-N. This other difference is integrated over time using another integration unit 806-N to produce the "Nth" feedback selection control signal 802-N.

These multiple feedback selection control signals 802-2 . . . 802-N are used to produce a portion of the multiple feedback signals 330-1 . . . 330-N, as described below with reference to FIG. 10. The core or first divider value 722-1 is also used to generate a feedback signal of the multiple feedback signals 330-1 . . . 330-N. There are therefore one fewer feedback selection control signals (N−1) than DSMs or divider values (N). Nevertheless, the feedback selection control signals 802 are designated from "-2" to "-N" to reflect the correspondences to other illustrated aspects, such as the multiple divider values 722-2 . . . 722-N. Before generating the multiple feedback signals 330-1 . . . 330-N, the multiple candidate feedback signals 726 are produced using the core feedback signal 724. This is described next with reference to FIG. 9.

Figure 9:
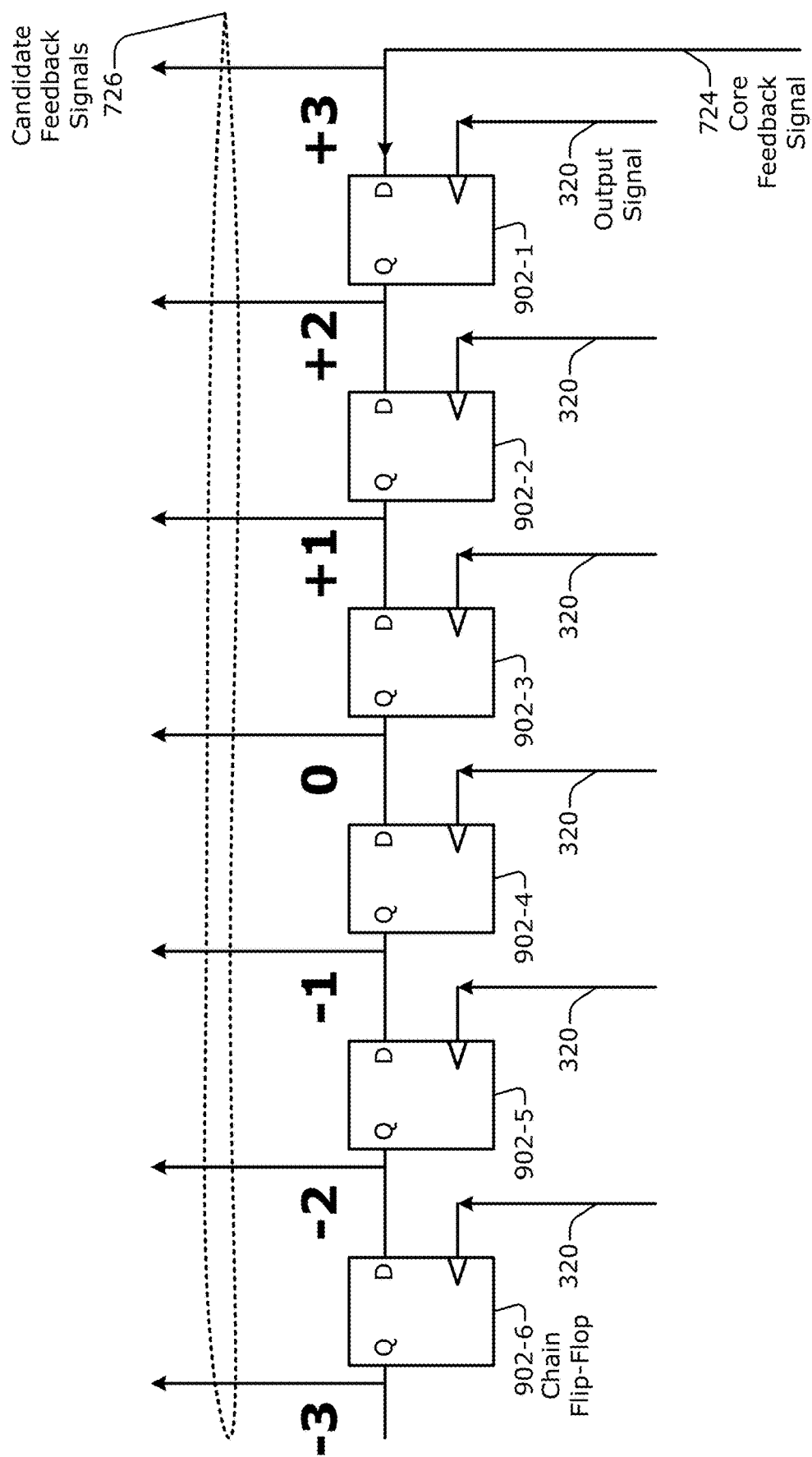
FIG. 9 illustrates an example flip-flop chain including multiple chain flip-flops that are used to produce multiple candidate feedback signals for the frequency divider of FIG. 7.

FIG. 9 illustrates an example flip-flop chain 708 including multiple chain flip-flops 902-1 . . . 902-6 to produce the multiple candidate feedback signals 726. Each candidate feedback signal of the multiple candidate feedback signals 726 is represented with zero or a plus/minus numeral, such as −3, −2, −1, 0, +1, +2, and +3. Here, the numerals range from −3 to +3 for an example implementation in which each DSM 702 (e.g., of FIGS. 7 and 8) is a 3rd-order DSM. Implementations with DSMs of different orders can have a different quantity of multiple candidate feedback signals 726. For example, with 4th-order DSMs, the flip-flop chain 708 can produce nine candidate feedback signals (e.g., −4 . . . 0 . . . +4).

In example implementations, each chain flip-flop 902 is coupled to other chain flip-flops of the flip-flop chain 708 in a serial manner to establish a chained arrangement of flip-flops. For example, an output of one chain flip-flop 902 is coupled to an input of a next or consecutive chain flip-flop 902. The output of the chain flip-flop 902-3 is coupled, for instance, to the input of the chain flip-flop 902-4. Thus, the flip-flop chain 708 includes multiple chain flip-flop inputs and multiple chain flip-flop outputs. As illustrated, the flip-flop chain 708 includes six chain flip-flops 902-1, 902-2, 902-3, 902-4, 902-5, and 902-6. A flip-flop chain 708 can, however, include a different quantity of flip-flops (e.g., depending on an order—second, fifth, etc.—of each of the multiple DSMs 702-1 . . . 702-N).

As shown, each chain flip-flop 902 can be realized as a "D" flip-flop having a D-input, a Q-output, and a clocking input. Thus, the Q-output of one chain flip-flop 902 is coupled to the D-input of a consecutive chain flip-flop 902 along the flip-flop chain 708. The D-input of the first chain flip-flop 902-1 is coupled to the core feedback signal 724, which is provided by the divider core 706 via the core output node 720 (e.g., of FIGS. 7 and 8). Here, the core feedback signal 724 also serves as the +3 delayed-version of the multiple candidate feedback signals 726. The chain flip-flops 902-1 . . . 902-6 can, however, be implemented differently, such as by using an alternative flip-flop type.

The clocking input of each chain flip-flop 902 is coupled to the output signal 320 from the VCO 306. Accordingly, a time-delayed version of the core feedback signal 724 is advanced between consecutive chain flip-flops 902 of the flip-flop chain 708 based on a frequency of the oscillations of the output signal 320. In this manner, the output of each respective chain flip-flop 902 provides a respective candidate feedback signal of the multiple candidate feedback signals 726 as a −3 to +3 delayed-version of the core feedback signal 724. One or more of these delayed versions of the core feedback signal 724, which can be output by a single divider core 706, is forwarded by the feedback signal selector 710 (e.g., of FIGS. 7 and 10) as a feedback signal 330. Thus, at least one chain flip-flop output (e.g., each Q-output) is coupled to the feedback signal selector 710 for each delayed-version of the core feedback signal 724. The associated signal selection is described next with reference to FIG. 10.

Figure 10:
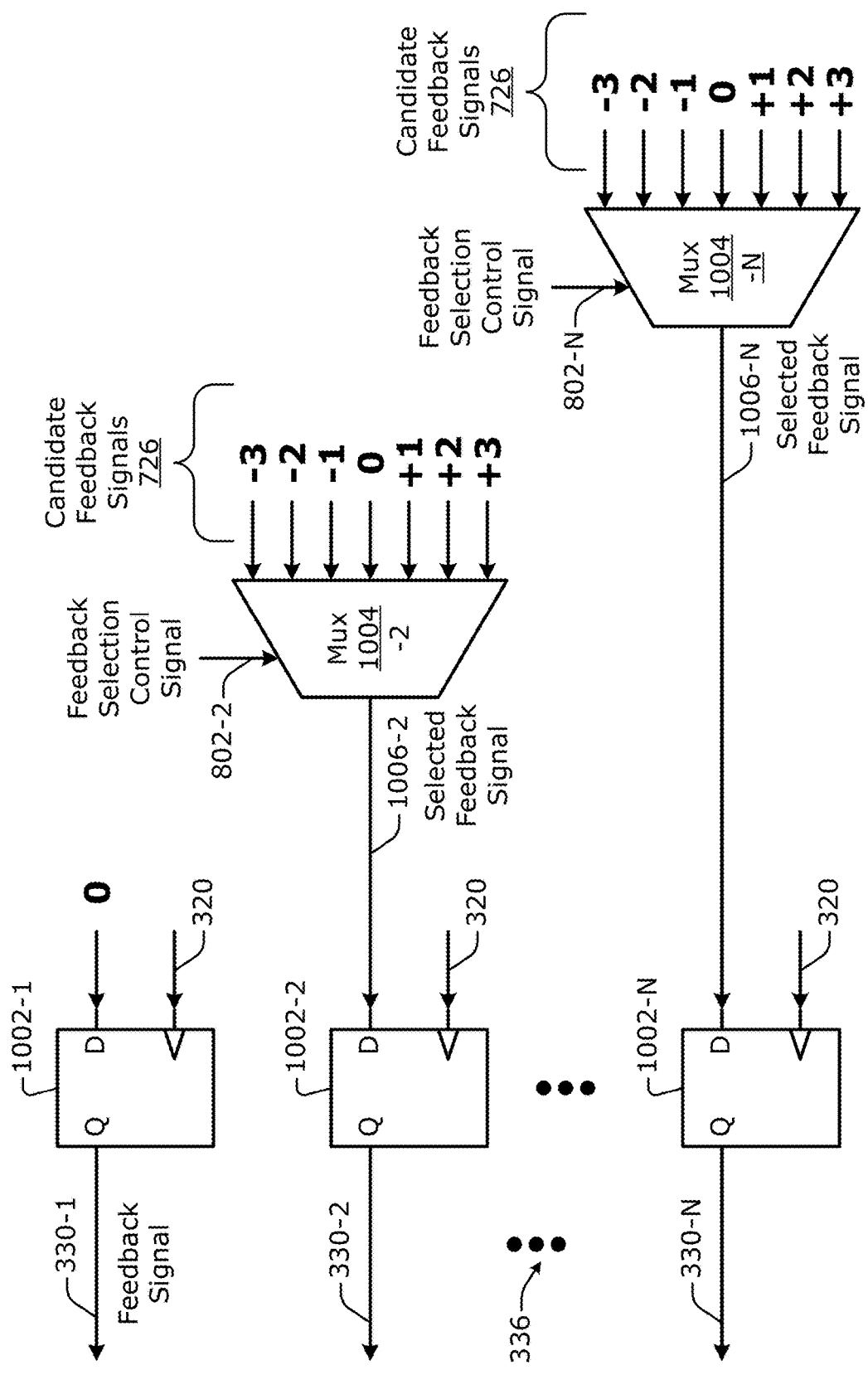
FIG. 10 illustrates an example feedback signal selector, which includes multiple flip-flops and multiple multiplexers for the frequency divider of FIG. 7, and an example scheme to select multiple feedback signals for processing by the multiple error determiners.

FIG. 10 illustrates an example feedback signal selector 710 including multiple flip-flops 1002-1 . . . 1002-N and multiple multiplexers 1004-2 . . . 1004-N (Mux 1004-2 to Mux 1004-N). FIG. 10 also illustrates an example scheme to select multiple feedback signals 330-1 . . . 330-N for processing by the multiple error determiners 132-1 . . . 132-N (e.g., of FIGS. 5 and 6). As shown, the feedback signal selector 710 includes multiple flip-flops 1002-1, 1002-2, . . . , 1002-N and multiple multiplexers 1004-2 . . . 1004-N. There are therefore one fewer multiplexers 1004-2 . . . 1004-N than multiple flip-flops 1002-1 . . . 1002-N or multiple feedback signals 330-1 . . . 330-N. The multiple flip-flops 1002-1 . . . 1002-N are implemented as "D" flip-flops in FIG. 10 and described below accordingly; however, the multiple flip-flops 1002-1 . . . 1002-N may be implemented with a different flip-flop type.

In example implementations, each respective flip-flop 1002 of the multiple flip-flops 1002-1 . . . 1002-N outputs a respective feedback signal 330 of the multiple feedback signals 330-1 . . . 330-N. The first flip-flop 1002-1 receives, at the D-input thereof, the "0" or central time-delayed version of the core feedback signal 724 (e.g., from the Q-output of the chain flip-flop 902-3 in FIG. 9) by "default"—meaning without dependence on a feedback selection control signal 802. The other flip-flops 902-2 . . . 902-N, however, receive at a respective input thereof a time-delayed version of the core feedback signal 724 based on a respective feedback selection control signal 802 using a respective multiplexer 1004. Each flip-flop 1002 of the multiple flip-flops 1002-1 . . . 1002-N receives the output signal 320 at a clocking input thereof. Thus, each flip-flop 1002 of the multiple flip-flops 1002-1 . . . 1002-N includes a respective flip-flop input of multiple flip-flop inputs and a respective flip-flop output of multiple flip-flop outputs.

Each multiplexer 1004 includes one or more multiplexer inputs, a multiplexer output, and a control terminal. Each multiplexer 1004 is responsible for selecting a selected feedback signal 1006 from among the multiple candidate feedback signals 726. The D-input of each respective flip-flop 1002 of multiple flip-flops 1002-2 . . . 1002-N is coupled to the output of each respective multiplexer 1004 of multiple multiplexers 1004-2 . . . 1004-N. The multiple inputs of each multiplexer 1004 is coupled to individual ones of the chain flip-flops 902 of the flip-flop chain 708 to receive the time-delayed versions of the core feedback signal 724, such as the −3, −2, −1, 0, +1, +2, and +3 versions of the core feedback signal 724. Each control input of each respective multiplexer 1004 of the multiple multiplexers 1004-2 . . . 1004-N is coupled to a respective feedback control signal 802 of the multiple feedback selection control signals 802-2 . . . 802-N (of FIG. 8). For example, the output of the second multiplexer 1004-2 is coupled to the D-input of the second flip-flop 1002-2. The Q-output of the second flip-flop 1002-2 provides the second feedback signal 330-2.

In example operations, each respective multiplexer 1004 of the multiple multiplexers 1004-2 . . . 1004-N provides a respective selected feedback signal 1006 of multiple selected feedback signals 1006-2 . . . 1006-N responsive to a respective feedback selection control signal 802 of multiple feedback selection control signals 802-2 . . . 802-N. For example, the second feedback selection control signal 802-2 can select the +3 time-delayed version of the core feedback signal 724 via the control input of the second multiplexer 1004-2. The second multiplexer 1004-2 therefore outputs the +3 version of the core feedback signal 724 as the second selected feedback signal 1006-2 and provides this +3 version to the D-input of the second flip-flop 1002-2. Responsive to an edge of the output signal 320, the second flip-flop 1002-2 forwards the second selected feedback signal 1006-2 as the second feedback signal 330-2. Other pairs of multiplexers and "feedback" flip-flops can operate analogously. These "feedback" flip-flops 1002-1 . . . 1002-N, as part of the feedback signal selector 710, can act as a retimer to remove noise and increase linearity. In these manners, the multiple flip-flops 1002-1 . . . 1002-N of the frequency divider 310 (e.g., of FIGS. 5 and 7) provide the multiple feedback signals 330-1 . . . 330-N to the multiple error determiners 132-1 . . . 132-N (e.g., of FIGS. 5 and 6).

Figure 11:
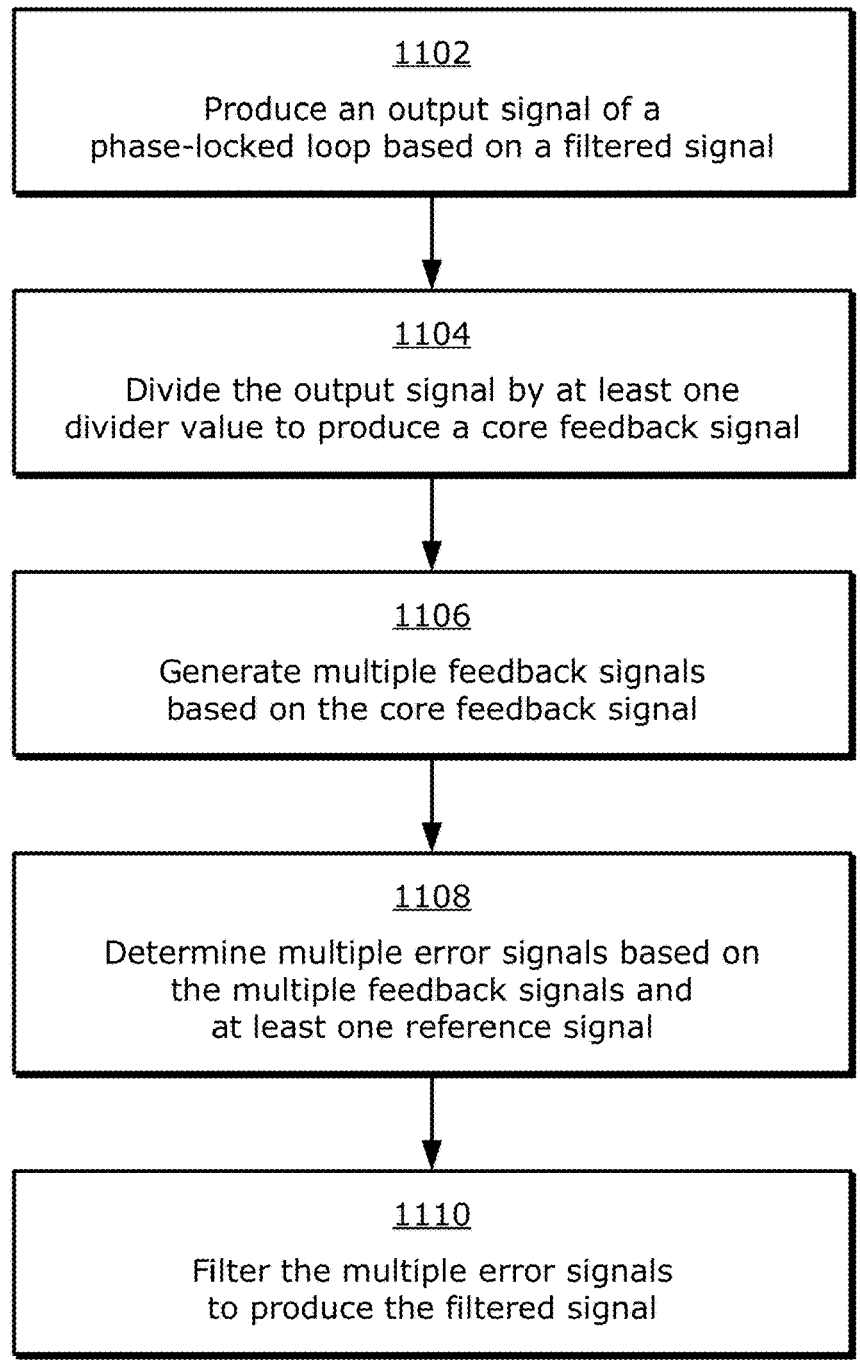
FIG. 11 is a flow diagram illustrating an example process for operating a PLL with multiple error determiners.

FIG. 11 is a flow diagram illustrating an example process 1100 for operating a PLL with multiple error determiners. The process 1100 is described in the form of a set of blocks 1102-1110 that specify operations that can be performed. However, operations are not necessarily limited to the order shown in FIG. 11 or described herein, for the operations may be implemented in alternative orders or in fully or partially overlapping manners. Also, more, fewer, and/or different operations may be implemented to perform the process 1100, or an alternative process. Operations represented by the illustrated blocks of the process 1100 may be performed by an electronic device 102, including by a PLL 130. More specifically, the operations of the process 1100 may be performed by multiple error determiners 132-1 . . . 132-N, a loop filter 304, a VCO 306, and a frequency divider 310 (e.g., of FIG. 5).

At block 1102, an output signal of the phase-locked loop is produced based on a filtered signal. For example, the PLL 130 can produce an output signal 320 of the PLL based on a filtered signal 334. For instance, the VCO 306 may oscillate the output signal 320 at an output frequency based on a characteristic (e.g., a voltage level) of the filtered signal 334.

At block 1104, the output signal is divided by at least one divider value to produce a core feedback signal. For example, the PLL 130 can divide the output signal 320 by at least one divider value 722 to produce a core feedback signal 724. This frequency division may be performed by a divider core 706 of the frequency divider 310 using a core or first divider value 722-1 that is provided by a first divider value generator, such as a first delta-sigma modulator 702-1 of multiple delta-sigma modulators 702-1 . . . 702-N.

At block 1106, multiple feedback signals are generated based on the core feedback signal. For example, the PLL 130 can generate multiple feedback signals 330-1 . . . 330-N based on the core feedback signal 724. In some cases, a digital circuitry portion of the frequency divider 310 may generate the multiple feedback signals 330-1 . . . 330-N based on multiple delayed versions of the core feedback signal 724 comprising multiple candidate feedback signals 726 using multiple divider values 722-1 . . . 722-N. To establish uncorrelated values, multiple divider value generators may be operated so as to be uncorrelated. For instance, each delta-sigma modulator 702 of the multiple delta-sigma modulators 702-1 . . . 702-N may be initialized with a different initialization value 704 of multiple initialization values 704-1 . . . 704-N.

At block 1108, multiple error signals can be determined based on the multiple feedback signals and at least one reference signal. For example, the PLL 130 can determine multiple error signals 332-1 . . . 332-N based on the multiple feedback signals 330-1 . . . 330-N and at least one reference signal 318. For instance, a respective error determiner 132 of multiple error determiners 132-1 . . . 132-N can determine a respective error signal 332 of multiple error signals 332-1 . . . 332-N based on respective differences between a respective feedback signal 330 of the multiple feedback signals 330-1 . . . 330-N and the reference signal 318. Each determination may include detecting respective phase-frequency differences using a phase-frequency detector 312 and pumping charge responsive to a respective phase-indication signal 328 using a charge pump 314 of each respective error determiner 132 of the multiple error determiners 132-1 . . . 132-N.

At block 1110, the multiple error signals are filtered to produce the filtered signal. For example, the PLL 130 can filter the multiple error signals 332-1 . . . 332-N to produce the filtered signal 334. To do so, the loop filter 304 may filter the multiple error signals 332-1 . . . 332-N to produce the filtered signal 334 using at least one filter capacitor 316. Prior to the filtration, an error signal combiner 502 may combine the multiple error signals 332-1 . . . 332-N to produce a combined error signal 508 such that the loop filter 304 filters the multiple error signals 332-1 . . . 332-N together using the combined error signal 508.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus for generating a frequency, the apparatus comprising:
   a phase-locked loop (PLL) comprising:
   a loop filter comprising a filter input node and a filter output node;
   a voltage-controlled oscillator (VCO) comprising a VCO input node and a VCO output node, the VCO input node coupled to the filter output node;
   a frequency divider comprising a divider input node, multiple divider output nodes, and a divider core coupled to the divider input node, the divider input node coupled to the VCO output node, the divider core comprising:
   a divider value input node; and
   a core output node coupled to the multiple divider output nodes; and
   multiple error determiners coupled between the multiple divider output nodes and the filter input node, the multiple error determiners comprising:
   multiple feedback input nodes, each feedback input node of the multiple feedback input nodes respectively coupled to a divider output node of the multiple divider output nodes; and
   multiple error output nodes coupled to the filter input node,
   the divider core configured to produce a core feedback signal based on at least one divider value; and
   the multiple error determiners configured to receive multiple feedback signals that are based on the core feedback signal.

2. The apparatus of claim 1, wherein each error determiner of the multiple error determiners comprises:
   a phase-frequency detector coupled to a divider output node of the multiple divider output nodes; and
   a charge pump coupled between the phase-frequency detector and the filter input node.

3. The apparatus of claim 1, wherein the VCO is configured to generate an output signal on the VCO output node, the output signal having the frequency.

4. The apparatus of claim 1, wherein each respective error determiner of the multiple error determiners is configured to produce a respective error signal of multiple error signals based on a respective feedback signal of the multiple feedback signals and a reference signal.

5. The apparatus of claim 1, wherein each respective error determiner of the multiple error determiners comprises:
   a phase-frequency detector comprising an input that is coupled to a respective feedback input node of the multiple feedback input nodes and a reference input node; and
   a charge pump comprising an input coupled to an output of the phase-frequency detector and an output coupled to a respective error output node of the multiple error output nodes.

6. The apparatus of claim 1, further comprising:
   an error signal combiner coupled between the multiple error determiners and the loop filter.

7. The apparatus of claim 6, wherein the error signal combiner comprises a current summer that is coupled between the multiple error output nodes and the filter input node.

8. The apparatus of claim 6, wherein the loop filter comprises at least one filter capacitor coupled to the filter input node and configured to accept current from the multiple error determiners.

9. The apparatus of claim 1, further comprising:
digital circuitry;
a first wire coupled between the digital circuitry and the divider value input node;
a second wire coupled between the core output node and the digital circuitry; and
multiple wires coupled between the digital circuitry and the multiple feedback input nodes, the multiple wires corresponding to the multiple divider output nodes,
wherein at least part of the frequency divider comprises a portion of the digital circuitry.

10. The apparatus of claim 9, wherein the portion of the digital circuitry comprises:
a flip-flop chain comprising multiple chain flip-flops, the flip-flop chain coupled to the core output node of the divider core via the second wire, each respective chain flip-flop of the multiple chain flip-flops comprising a respective chain flip-flop output of multiple chain flip-flop outputs.

11. The apparatus of claim 10, wherein the portion of the digital circuitry comprises:
multiple flip-flops comprising multiple flip-flop inputs and multiple flip-flop outputs, each respective flip-flop of the multiple flip-flops comprising a respective flip-flop input of the multiple flip-flop inputs and a respective flip-flop output of multiple flip-flop outputs, each respective flip-flop input of the multiple flip-flop inputs coupled to at least one chain flip-flop output of the multiple chain flip-flop outputs, wherein the multiple flip-flop outputs are coupled to the multiple feedback input nodes via the multiple wires;
multiple multiplexers, each multiplexer of the multiple multiplexers comprising a multiplexer output coupled to a respective flip-flop input of the multiple flip-flop inputs of at least a portion of the multiple flip-flops, each multiplexer of the multiple multiplexers comprising one or more multiplexer inputs coupled to the multiple chain flip-flop outputs of the flip-flop chain, each multiplexer of the multiple multiplexers comprising a respective control terminal; and
multiple delta-sigma modulators, each respective delta-sigma modulator (DSM) of the multiple delta-sigma modulators comprising a respective DSM output,
wherein each respective DSM output is coupled to a respective control terminal of a respective multiplexer of the multiple multiplexers.

12. An apparatus for generating a frequency used in the processing of signals for wireless communication, the apparatus comprising:
a phase-locked loop (PLL) comprising:
oscillation means for producing an output signal of the phase-locked loop based on a filtered signal;
feedback means for dividing the output signal by at least one divider value to produce multiple feedback signals, the feedback means comprising core means for dividing the output signal by the at least one divider value to produce a core feedback signal, the feedback means comprising means for producing the multiple feedback signals based on the core feedback signal;
determination means for determining multiple error signals based on the multiple feedback signals and at least one reference signal; and
filtration means for filtering the multiple error signals to produce the filtered signal.

13. The apparatus of claim 12, further comprising:
combination means for combining the multiple error signals to produce a combined error signal,
wherein the filtration means comprises means for filtering the multiple error signals to produce the filtered signal using the combined error signal.

14. The apparatus of claim 12, wherein the feedback means comprises:
modulation means for producing multiple divider values, the multiple divider values including the at least one divider value;
chained means for producing multiple delayed versions of the core feedback signal; and
selection means for selecting, for each feedback signal of the multiple feedback signals, a delayed-version of the multiple delayed versions of the core feedback signal responsive to at least a portion of the multiple divider values.

15. A method for operating a phase-locked loop (PLL), the method comprising:
producing an output signal of the phase-locked loop based on a filtered signal;
dividing the output signal by at least one divider value to produce a core feedback signal;
generating multiple feedback signals based on the core feedback signal;
determining multiple error signals based on the multiple feedback signals and at least one reference signal; and
filtering the multiple error signals to produce the filtered signal.

16. The method of claim 15, further comprising:
combining the multiple error signals into a combined error signal,
wherein the filtering comprises filtering the combined error signal to produce the filtered signal.

17. The method of claim 15, wherein:
the dividing comprises generating multiple divider values; and
the generating the multiple feedback signals comprises:
delaying the core feedback signal to produce multiple delayed versions of the core feedback signal;
producing multiple feedback selection control signals based on one or more comparisons between the multiple divider values; and
selecting from among the multiple delayed versions of the core feedback signal based on the multiple feedback selection control signals to generate the multiple feedback signals.

18. The method of claim 15, wherein the determining comprises:
detecting a respective phase-frequency difference of multiple phase-frequency differences between the at least one reference signal and a respective feedback signal of the multiple feedback signals to determine multiple phase-indication signals; and
pumping charge responsive to each respective phase-indication signal of the multiple phase-indication signals to produce each respective error signal of the multiple error signals.

19. The apparatus of claim 9, wherein the portion of the digital circuitry comprises:
multiple delta-sigma modulators, at least one delta-sigma modulator (DSM) of the multiple delta-sigma modulators coupled to the divider value input node via the first wire, each respective delta-sigma modulator of the multiple delta-sigma modulators coupled to a respective register configured to store a respective initialization value for the respective delta-sigma modulator.

20. The apparatus of claim 1, further comprising:
digital circuitry comprising at least part of the frequency divider, the at least part of the frequency divider configured to produce the multiple feedback signals using the core feedback signal.

* * * * *